(12) United States Patent
Jang et al.

(10) Patent No.: US 11,296,294 B2
(45) Date of Patent: Apr. 5, 2022

(54) DISPLAY DEVICE COMPRISING QUANTUM DOT EMISSION LAYER

(71) Applicant: SAMSUNG ELECTRONICS CO., LTD., Suwon-si (KR)

(72) Inventors: Hyo Sook Jang, Suwon-si (KR); Tae Hyung Kim, Seoul (KR); Eun Joo Jang, Suwon-si (KR); Oul Cho, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 23 days.

(21) Appl. No.: 16/910,369

(22) Filed: Jun. 24, 2020

(65) Prior Publication Data

US 2020/0411784 A1 Dec. 31, 2020

(30) Foreign Application Priority Data

Jun. 27, 2019 (KR) .................. 10-2019-0077344
Jun. 24, 2020 (KR) .................. 10-2020-0077074

(51) Int. Cl.
*H01L 51/50* (2006.01)

(52) U.S. Cl.
CPC ........ *H01L 51/502* (2013.01); *H01L 51/5036* (2013.01)

(58) Field of Classification Search
None
See application file for complete search history.

(56) References Cited

U.S. PATENT DOCUMENTS

| | | | |
|---|---|---|---|
| 10,365,509 B2 | 7/2019 | Jeon et al. | |
| 10,424,623 B2 | 9/2019 | Lee | |
| 10,606,112 B2 | 3/2020 | Jeon et al. | |
| 2017/0242292 A1* | 8/2017 | Jeon | G02F 1/133502 |
| 2018/0269260 A1* | 9/2018 | Ghosh | H01L 27/3244 |
| 2018/0314112 A1 | 11/2018 | Chen et al. | |
| 2019/0112523 A1* | 4/2019 | Kim | C09K 11/883 |
| 2020/0335562 A1* | 10/2020 | Kim | H01L 51/56 |
| 2020/0395416 A1* | 12/2020 | Bae | H01L 51/5284 |

FOREIGN PATENT DOCUMENTS

| | | |
|---|---|---|
| KR | 101649237 B1 | 8/2016 |
| KR | 20170008591 A | 1/2017 |
| KR | 20170099026 A | 8/2017 |

\* cited by examiner

*Primary Examiner* — Daniel Whalen
(74) *Attorney, Agent, or Firm* — Cantor Colburn LLP

(57) ABSTRACT

A display device including a light source; and a quantum dot emission layer disposed on the light source, wherein the quantum dot emission layer includes a first emission layer disposed in a red pixel of the display device, and a second emission layer disposed in a green pixel of the display device, the light source includes a first portion configured to supply a first incident light to the first emission layer, a second portion configured to supply a second incident light to the second emission layer, and a third portion configured to supply a third light to a blue pixel of the display device, the first emission layer includes red light emitting quantum dots and the second emission layer includes green light emitting quantum dots, and each of the first portion, the second portion, and the third portion comprises a layer comprising blue light emitting quantum dots.

23 Claims, 7 Drawing Sheets

Pattern Preparation by using a photoresist

Repeating the Patterning Process three times

DISPLAY DEVICE COMPRISING QUANTUM DOT EMISSION LAYER

CROSS-REFERENCE TO RELATED APPLICATION

This application claims priority to and the benefit of Korean Patent Application No. 10-2019-0077344 filed in the Korean Intellectual Property Office on Jun. 27, 2019, and of Korean Patent Application No. 10-2020-0077074, filed in the Korean Intellectual Property Office on Jun. 24, 2020, and all the benefits accruing therefrom under 35 U.S.C. § 119, the contents of which in their entirety are herein incorporated by reference.

BACKGROUND

1. Field

A display device is disclosed.

2. Description of the Related Art

A semiconductor nanocrystal is a nano-sized semiconductor nanocrystal, which is also called a quantum dot. Unlike a bulk material, a semiconductor nanocrystal may have a different bandgap energy by controlling a size and a composition of the nanocrystal. A semiconductor nanocrystal may exhibit electroluminescence and photoluminescence properties, and thus may be applied, e.g., used, in various fields. However, there is a desire for development of a quantum dot that does not include cadmium, lead, or mercury, and an electronic device including such a quantum dot from an environmental perspective, while realizing improved light emitting properties in the electronic device including such a quantum dot.

SUMMARY

An embodiment provides a display device including environmentally-friendly quantum dots and capable of improving luminous efficiency, color reproducibility, and luminance.

In an embodiment, a display device includes a light source; and a quantum dot emission layer disposed on the light source, wherein the quantum dot emission layer includes a first emission layer disposed in a red pixel of the display device, the red pixel being configured to emit a first light and a second emission layer disposed in a green pixel of the display device, the green pixel being configured to emit a second light, the light source includes a first portion configured to supply a first incident light to the first emission layer, a second portion configured to supply a second incident light to the second emission layer, and a third portion configured to supply a third light to a blue pixel of the display device, the first emission layer includes red light emitting quantum dots dispersed in a first polymer matrix, the second emission layer includes green light emitting quantum dots dispersed in a second polymer matrix, each of the first portion, the second portion, and the third portion includes electrodes facing each other and a layer including blue light emitting quantum dots disposed between the electrodes, at least one of the first incident light, the second incident light, or the third light has a maximum emission peak wavelength in a range of less than or equal to about 458 nanometers (nm), at least one of the first incident light, the second incident light, or the third light has a full width at half maximum (FWHM) of a maximum emission peak of less than or equal to about 30 nm, and the red light emitting quantum dots, the green light emitting quantum dots, and the blue light emitting quantum dots include at least one of a Group II-VI compound or a Group III-V compound and do not include cadmium, mercury, or lead.

The Group II-VI compound may include at least one of ZnSe, ZnTe, ZnS, ZnSeTe, ZnSeS, ZnSTe, or ZnTeSeS.

The Group III-V compound may include at least one of InP, GaP, InAs, GaAs, InSb, GaSb, InGaP, InAsP, or InSbP.

The blue light emitting quantum dots may include a Group II-VI compound, the Group II-VI compound include zinc and tellurium, and a mole ratio of the tellurium (Te) relative to the zinc (Zn) may be less than or equal to about 0.1:1.

A maximum emission peak wavelength of the third light may be different from a maximum emission peak wavelength of the first incident light.

A maximum emission peak wavelength of the third light may be different from a maximum emission peak wavelength of the second incident light.

The first incident light and the second incident light may each independently have a maximum emission peak wavelength in a range of less than or equal to about 450 nm.

The first incident light and the second incident light may have the same maximum emission peak wavelength.

The first incident light and the second incident light may have a different maximum emission peak wavelength.

The first incident light and the second incident light may each independently have a maximum emission peak wavelength in a range of less than or equal to about 440 nm.

At least one of the first incident light, the second incident light, or the third light may have a full width at half maximum (FWHM) of a maximum emission peak of less than or equal to about 25 nm.

At least one of the first incident light, the second incident light, or the third light may have a full width at half maximum (FWHM) of a maximum emission peak of less than or equal to about 20 nm.

The layer comprising blue light emitting quantum dots may further include green light emitting quantum dots.

Each of the first portion and the second portion may include electrodes facing each other and a layer comprising blue light emitting quantum dots disposed between the electrodes; and the third portion may include electrodes facing each other and a layer comprising blue light emitting quantum dots and green light emitting quantum dots disposed between the electrodes.

The display device may include a first partition between the first portion and the second portion, the first partition that optically isolating the first portion and the second portion.

The display device may include a second partition between the first portion and the third portion, the second partition optically isolating the first portion and the third portion.

The display device may include a third partition between the second portion and the third portion, the third partition optically isolating the second portion and the third portion.

A maximum emission peak wavelength of the second light may be in a range of less than or equal to about 545 nm.

At least one of a maximum emission peak of the first light or a maximum emission peak of the second light may have a full width at half maximum (FWHM) of less than or equal to about 45 nm.

A ratio ($S_{RG}:A_R$) of an overlapping area ($S_{RG}$) of an emission spectrum of the first light and an emission spectrum of the second light to a total area of the emission spectrum of the first light ($A_R$) may be less than or equal to about 0.01:1.

A ratio ($S_{RG}:A_G$) of an overlapping area ($S_{RG}$) of an emission spectrum of the first light and an emission spectrum of the second light to a total area of the emission spectrum of the second light ($A_G$) may be less than or equal to about 0.01:1.

A ratio ($S_{GB}:A_G$) of an overlapping area ($S_{GB}$) of an emission spectrum of the second light and an emission spectrum of the third light to a total area of the emission spectrum of the second light ($A_G$) may be less than or equal to about 0.01:1.

A ratio ($S_{GB}:A_B$) of an overlapping area ($S_{GB}$) of an emission spectrum of the second light and an emission spectrum of the third light to a total area of the emission spectrum of the third light ($A_B$) may be less than or equal to about 0.01:1. In an ultraviolet-visible (UV-Vis) absorption spectrum of the red light emitting quantum dots, a ratio ($I_{R,440}:I_{R,458}$) between an absorption intensity ($I_{R,440}$) at a wavelength of 440 nm and an absorption intensity ($I_{R,458}$) at a wavelength of 458 nm may be greater than or equal to about 1.0:1.

In a UV-Vis absorption spectrum of the red light emitting quantum dots, a ratio ($I_{R,440}:I_{R,458}$) between an absorption intensity ($I_{R,440}$) at a wavelength of 440 nm and an absorption intensity ($I_{R,458}$) at a wavelength of 458 nm may be less than or equal to about 10:1.

In a UV-Vis absorption spectrum of the green light emitting quantum dots, a ratio ($I_{G,440}:I_{G,458}$) between an absorption intensity ($I_{G,440}$) at a wavelength of 440 nm and an absorption intensity ($I_{G,458}$) at a wavelength of 458 nm may be greater than or equal to about 1.3:1.

In a UV-Vis absorption spectrum of the green light emitting quantum dots, a ratio ($I_{G,440}:I_{G,458}$) between an absorption intensity ($I_{G,440}$) at a wavelength of 440 nm and an absorption intensity ($I_{G,458}$) at a wavelength of 458 nm may be less than or equal to about 20:1.

The first polymer matrix and the second polymer matrix may each independently include at least one of a cross-linking polymer or a binder polymer having a carboxylic acid group.

The cross-linking polymer may include at least one of a polymerization product of a photopolymerizable monomer having a carbon-carbon double bond or a polymerization product of the photopolymerizable monomer and a multiple thiol compound having at least two thiol groups at a terminal end thereof.

The display device may further include a light transmittance layer disposed within the blue pixel, the light transmittance layer transmitting the third light provided by the third portion.

The display device may further include a fourth partition between the first emission layer and the light transmittance layer, the fourth partition optically isolating the first emission layer and the light transmittance layer, and a fifth partition between the second emission layer and the light transmittance layer, the fifth partition optically isolating the second emission layer and the light transmittance layer.

The display device may have a color reproducibility of greater than or equal to about 85% of the BT2020 standard.

The display device according to an embodiment may exhibit excellent luminous efficiency, color reproducibility, and luminance values.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
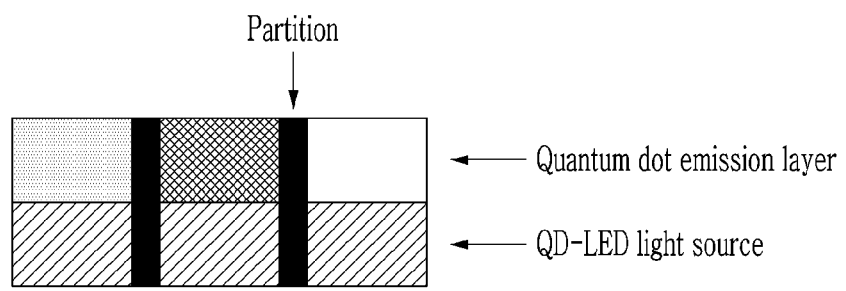
FIG. 1 shows a schematic cross-sectional view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

It will be understood that when an element such as a layer, film, region, or substrate is referred to as being "on" another element (element or member), it can be directly on the other element or intervening elements may also be present. In contrast, when an element is referred to as being "directly on" another element, there are no intervening element/members present.

Further, the singular includes the plural unless mentioned otherwise. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer" or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "metal" refers to a metal such as an alkaline metal, an alkaline-earth metal, a transition metal, a base metal, and the like or a semi-metal in the periodic table.

As used herein, "color reproducibility (color gamut ratio)" refers to an area matching percentage of color reproduction ranges to the standard color reproduction range of a device. The area matching percentage is a percentage (S2/S1×100%) of an area (S2) of the portion in which the standard color reproduction range and the color reproduction range of the device overlap with the area (S1) of the standard color reproduction range (triangle area). The color reproducibility of, e.g., according to, the BT2020 standard is a matching percentage of a color gamut of a display device relative to the color gamut according to each standard in the CIE color coordinates (i.e., a percentage of an area of the corresponding portion to the total area of the reference color gamut).

As used herein, unless otherwise defined, a full width at half maximum (FWHM) refers to a FWHM of the maximum emission peak in the emission spectrum of the quantum dot.

As used herein, when a definition is not otherwise provided, "substituted" refers to replacement of at least one hydrogen of a compound or the corresponding moiety by a substituent of at least one of a C1 to C30 alkyl group, a C1 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are each independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), or a phosphoric acid group (—PO$_3$H$_2$) or a salt thereof (—PO$_3$MH or —PO$_3$M$_2$, wherein M is an organic or inorganic cation).

Herein, "hydrocarbon group" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by at least one of an oxide moiety, a carbonyl moiety, an ester moiety, or —NH—.

Herein, "alkyl" refers to a linear or branched saturated monovalent hydrocarbon group (methyl, ethyl, hexyl, etc.).

Herein, "alkenyl" refers to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of at least one hydrogen from an aromatic group (e.g., a phenyl or naphthyl group).

Herein, "hetero" refers to one including 1 to 3 heteroatoms of N, O, S, Si, or P.

As used herein, "dispersion" refers to dispersion wherein a dispersed phase is a solid and a continuous phase includes a liquid. For example, "dispersion" refers to a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., less than or equal to about 2 μm, or less than or equal to about 1 μm).

As used herein, "Group" refers to a group of Periodic Table.

Semiconductor nanocrystals (hereinafter, also referred to as quantum dots) are nanocrystals having a size smaller than a diameter corresponding to the Bohr exciton radius in the bulk crystal of the same material. By reducing the core size of the nanocrystals, quantum confinement of electrons, holes, and excitons may be increased and light corresponding to the bandgap energy thereof may be emitted. Bandgap energies of quantum dots may be changed according to, e.g., by changing, sizes, structures, and compositions. For example, as the sizes of quantum dots increase, the quantum dots may have narrow bandgap energies and increased emission wavelengths. However, since the quantum dot has a nano-scale size, photoluminescence characteristics and stability of the quantum dot may be affected by the external environment, and securing sufficient dispersion for various media may be difficult. Therefore, it may be difficult (in terms of implementation of desired light emitting characteristics and reliability) to apply, e.g., use, quantum dots in devices, despite inherent excellent physical properties of the quantum dots.

Furthermore, quantum dots having desirable electroluminescence and/or photoluminescence properties may be include cadmium (Cd). Cadmium may raise environmental and/or health issues and is a restricted element defined under Restriction of Hazardous Substances Directive (RoHS) in a plurality of countries. Therefore, development of a quantum dot-based display device that does not include heavy metals such as cadmium, lead, or mercury, while exhibiting relatively high color reproducibility with a reference to the BT2020 standard as well as desirable electroluminescence and/or photoluminescence properties is desired.

FIG. 1 shows a schematic cross-sectional view of a display device according to an embodiment.

Referring to FIG. 1, a display device according to an embodiment includes a red pixel (also referred to herein as a red color pixel), a green pixel (also referred to herein as a green color pixel), and a blue pixel (also referred to herein as a blue color pixel). The display device includes a light source (e.g., a quantum dot (QD)-light emitting diode (LED) light source); and a quantum dot emission layer disposed on the light source and including a polymer matrix. The quantum dot emission layer includes a first emission layer disposed in, e.g., corresponding to, the red pixel, the red pixel being configured to emit a first light, and a second emission layer disposed in, e.g., corresponding to, the green pixel, the green pixel being configured to emit a second light.

Referring to FIG. 1, the light source may include a first element (also referred to herein as a first portion) configured to supply a first incident light to the first emission layer, a second element (also referred to herein as a second portion) configured to supply a second incident light to the second emission layer, and a third element (also referred to herein as a third portion) configured to supply a third light to the blue pixel.

The first element may be present in a red color pixel section, the second element may be present in a green color pixel section, and the third element may be present in a blue color pixel section. The first element, the second element, and the third element may each independently be present and for example another portion (another element or member) may be present between the first element, the second element, and the third element.

For example, the display device may include a partition, e.g., partition wall (also referred to as a pixel define layer), that optically isolates the first element and the second element between the first element and the second element, the display device may include a partition wall that optically isolates the first element and the third element between the first element and the third element, and the display device may include a partition wall that optically isolates the second element and the third element between the second element and the third element. The first element, the second element, and the third element may each independently be patterned by inkjet printing to correspond to the red color pixel section, the green color pixel section, and the blue color pixel section.

Although not shown in FIG. 1, the light source may be formed on the first substrate. The first substrate may be transparent. The first substrate may be rigid or flexible. The first substrate may be a plastic, glass, or a metal.

Although not shown in FIG. 1, the light source may include the two electrodes facing each other. The electrodes may each independently be a pixel electrode or a common electrode. One of the two electrodes may be a pixel electrode and the other of the electrodes may be a common electrode. One of the two electrodes may include a cathode and the other may include an anode. For example, the cathode and the anode may each independently be a pixel electrode or a common electrode. For example, the pixel electrode may be a cathode, the common electrode may be an anode or the pixel electrode may be an anode, and the common electrode may be a cathode.

At least one of the electrodes may be patterned to correspond to the first element, the second element, and the third element. For example, the pixel electrode may be patterned corresponding to a red pixel section, a green color partition, and a blue color pixel section.

At least one of the two electrodes (e.g., cathode and anode) may be a light transmitting electrode or a transparent electrode. For example, the two electrodes (e.g., cathode and anode) may be all light transmitting electrodes. For example, the two electrodes (e.g., cathode and anode) may be light transmitting electrodes or opaque electrodes. For example, the light transmitting electrode and the light transmitting electrode may be disposed on the first substrate.

For example, the light transmitting electrode may be made of, for example a transparent conductor such as the indium tin oxide (ITO) or indium zinc oxide (IZO), gallium indium tin oxide, zinc indium tin oxide, titanium nitride, polyaniline, LiF/Mg:Ag, and the like, or a metal thin film of a thin monolayer or multilayer but is not limited thereto. For example, the opaque electrode may be made of an opaque conductor such as aluminum (Al), a lithium aluminum (Li:Al) alloy, a magnesium-silver alloy (Mg:Ag), lithium fluoride-aluminum (LiF:Al).

The thickness of the two electrodes (e.g., cathode and anode) is not particularly limited and may be appropriately selected considering the efficiency of the display device. For example, the thickness of the anode (or cathode) may be greater than or equal to about 5 nm, for example, greater than or equal to about 50 nm. For example, the thickness of the anode (or cathode) may be less than or equal to about 100 µm, for example, less than or equal to about 10 µm, less than or equal to about 1 µm, less than or equal to about 900 nm, less than or equal to about 500 nm, or less than or equal to about 100 nm.

Although not specifically shown in FIG. 1, the light source may include a layer including the blue light emitting quantum dots. The layer comprising the blue light emitting quantum dots may be disposed between the aforementioned two opposite electrodes (e.g., cathode and anode), and for example, the first element, the second element, and the third element of the light source may each independently include blue light emitting quantum dots.

The blue light emitting quantum dots may accept electrical energy provided by the anode and the cathode and may emit blue light. For example, when a voltage is applied between the anode and the cathode, holes and electrons (e.g., holes and electrons injected into a charge (hole) auxiliary layer that is disposed adjacent to the anode or a charge (electron) auxiliary layer that is disposed adjacent to the cathode) move to oppositely charged electrodes, respectively. Then, when the holes and the electrons are located on a layer including blue light emitting quantum dots, the holes and the electrons are recombined to generate excitons and to emit blue light.

The blue light emitting quantum dots (hereinafter, also referred to as blue light emitting semiconductor nanocrystals) are not particularly limited and may, for example, be commercially available or may be synthesized through a chemical wet process. In the chemical wet method, crystal particles are grown by reacting precursor materials in an organic solvent, and organic solvent or ligand compound is naturally coordinated to a surface of the quantum dots to control a growth of crystals. The organic solvents and ligand compounds are not particularly limited. The blue light emitting quantum dots may be dispersed in an organic solvent, and for example, the quantum dots may be dispersed in at least one of a C6 to C40 aliphatic hydrocarbon or a C6 to C40 substituted or unsubstituted aromatic hydrocarbon. The layer including blue light emitting quantum dots may be formed by spray coating an organic solvent in which the blue light emitting quantum dots are dispersed, but is not limited thereto. In an embodiment, the layer including blue light emitting quantum dots does not include an organic light emitting material, and does not include as an example an organic fluorescent material, or an organic phosphorescent material.

The blue light emitting quantum dots may include at least one of a Group II-VI compound or a Group III-V compound, and in an embodiment does not include cadmium, mercury, or lead.

For example, the Group II-VI compound may include at least one of ZnSe, ZnTe, ZnS, ZnSeTe, ZnSeS, ZnSTe, ZnTeSeS, ZnO, MgSe, MgS, MgZnSe, or MgZnS, and the Group III-V compound may include at least one of InP, GaP, InAs, GaAs, InSb, GaSb, InGaP, InAsP, InSbP, GaN, AlN, AlP, AlAs, AlSb, InN, GaNP, GaNAs, GaNSb, GaPAs, GaPSb, AlNP, AlNAs, AlNSb, AlPAs, AlPSb, InNP, InNAs, InNSb, InPAs, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb.

The blue light emitting quantum dots may include a Group II-VI compound, wherein the Group II-VI compound may include at least one of zinc, selenium, or tellurium. For example, at least a portion of the blue light emitting quantum dots may include Zn (zinc), and Se (selenium); for example, at least a portion of the blue light emitting quantum dots may include Zn (zinc), and Te (tellurium); and for example, at least a portion of the blue light emitting quantum dots may include Zn (zinc), Te (tellurium), and Se (selenium).

The blue light emitting quantum dots may have a core/shell structure. Herein, the interface between the core and the shell may have a concentration gradient structure in which concentrations of elements in the shell decreases toward the center. However, in an embodiment, in the blue light emitting quantum dots, both core and shell do not include cadmium, lead, or mercury.

For example, the blue light emitting quantum dots may include a core including a first semiconductor material including at least one of zinc, tellurium, or selenium; and a shell disposed on at least a portion of the core, and including a second semiconductor material (e.g., including Zn, Se, and S, or composed of them) having a different composition from the first semiconductor material. The first semiconductor material and the second semiconductor material may each independently include a different compound of at least one of ZnSe, ZnSeS, ZnTe, ZnSeTe, ZnSTe, or ZnTeSeS.

In the blue light emitting quantum dot, a content of tellurium may be smaller than that of selenium, and when the first semiconductor material of the core includes tellurium (Te), the first semiconductor material of the core may include a limited content of tellurium (Te). The core may include $ZnTe_xSe_{1-x}$ (wherein, x is greater than or equal to about 0 and less than or equal to about 0.05). By increasing a ratio of the tellurium content to the selenium content in the core, a wavelength of the maximum emission peak of the blue light emitting quantum dot particles may be increased. In the core, the tellurium content may be greater than or equal to about 0.001 mol (moles), greater than or equal to about 0.005 mol, greater than or equal to about 0.006 mol, greater than or equal to about 0.007 mol, greater than or equal to about 0.008 mol, greater than or equal to about 0.009 mol, greater than or equal to about 0.01 mol, or greater than or equal to about or 0.02 mol, based on 1 mol of selenium. In the core, the tellurium content may be less than or equal to about 0.053 mol, for example, less than or equal to about 0.05 mol, less than or equal to about 0.049 mol, less than or equal to about 0.048 mol, less than or equal to about 0.047 mol, less than or equal to about 0.046 mol, less than or equal to about 0.045 mol, less than or equal to about 0.044 mol, less than or equal to about 0.043 mol, less than or equal to about 0.042 mol, less than or equal to about 0.041 mol, or less than or equal to about 0.04 mol, based on 1 mol of selenium. Without being bound by any particular theory, the core may have various, e.g., many, forms in terms of the distributions of Zn, Se, and Te.

For example, the second semiconductor material may include zinc (Zn), selenium (Se), and sulfur (S). In the blue light emitting quantum dot, the shell may be a multi-layered shell. The multi-layered shell may include a first layer and an outermost layer that is disposed directly on the core, the first layer may include ZnSeS, and the outermost layer may include ZnS. The shell may include a gradient alloy and a sulfur content may have a concentration gradient in which the sulfur content increases in a direction away from the core.

In the blue light emitting quantum dots, a ratio of a mole content of the tellurium relative to a mole content of the selenium (e.g., measured by a inductively coupled plasma-atomic emission spectrometry (ICP-AES)) may be less than or equal to about 0.05:1, less than or equal to about 0.049:1, less than or equal to about 0.048:1, less than or equal to about 0.047:1, less than or equal to about 0.045:1, less than or equal to about 0.044:1, less than or equal to about 0.043:1, less than or equal to about 0.042:1, less than or equal to about 0.041:1, less than or equal to about 0.04:1, less than or equal to about 0.039:1, less than or equal to about 0.035:1, less than or equal to about 0.03:1, less than or equal to about 0.029:1, less than or equal to about 0.025:1, less than or equal to about 0.024:1, less than or equal to about 0.023:1, less than or equal to about 0.022:1, less than or equal to about 0.021:1, less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.01:1. The mole ratio of the tellurium relative to the selenium may be greater than or equal to about 0.001:1, greater than or equal to about 0.002:1, greater than or equal to about 0.003:1, greater than or equal to about 0.004:1, greater than or equal to about 0.005:1, greater than or equal to about 0.006:1, or greater than or equal to about 0.007:1. The mole ratio of the tellurium relative to the selenium may be about 0.004:1 to about 0.025:1.

In the blue light emitting quantum dots, the zinc content may be greater than the selenium content. In the blue light emitting quantum dots, the mole ratio of tellurium relative to zinc (e.g., determined by an inductively coupled plasma-atomic emission spectrometry) may be less than or equal to about 0.02:1, less than or equal to about 0.019:1, less than or equal to about 0.018:1, less than or equal to about 0.017:1, less than or equal to about 0.016:1, less than or equal to about 0.015:1, less than or equal to about 0.014:1, less than or equal to about 0.013:1, less than or equal to about 0.012:1, less than or equal to about 0.011:1, or less than or equal to about 0.010:1.

In the blue light emitting quantum dots, the zinc (Zn) content may be greater than the selenium (Se) content and the selenium content may be greater than the tellurium content (e.g., as determined by ICP-AES analysis).

For example, in the ICP-AES analysis of the blue light emitting quantum dots, a mole ratio of Se relative to Zn may be less than about 1:1, for example, less than or equal to about 0.95:1, less than or equal to about 0.90:1, less than or equal to about 0.85:1, less than or equal to about 0.8:1, less than or equal to about 0.7:1, less than or equal to about 0.6:1, less than or equal to about 0.5:1, or less than or equal to about 0.4:1. The mole ratio of Se relative to Zn may be greater than or equal to about 0.05:1, for example, greater than or equal to about 0.1:1, or greater than or equal to about 0.2:1.

For example, in the ICP-AES analysis of the blue light emitting quantum dots, a mole ratio of Te relative to Zn may be less than or equal to about 0.1:1, for example, less than or equal to about 0.07:1, less than or equal to about 0.05:1, less than or equal to about 0.03:1, less than or equal to about 0.027:1, less than or equal to about 0.025:1, less than or equal to about 0.02:1 less than or equal to about 0.019:1, less than or equal to about 0.018:1, less than or equal to about 0.017:1, less than or equal to about 0.016:1, less than or equal to about 0.015:1, less than or equal to about 0.01:1, less than or equal to about 0.009:1, less than or equal to about 0.008:1, less than or equal to about 0.007:1, less than or equal to about 0.006:1, or less than or equal to about 0.005:1. The mole ratio of Te relative to Zn may be greater than or equal to about 0.001:1, greater than or equal to about 0.002:1, or greater than or equal to about 0.003:1. In the blue light emitting quantum dots according to an embodiment, a tellurium content may be less than or equal to about 1 weight percent (wt %), based on a total weight of the semiconductor nanocrystal particle. In an embodiment, the blue light emitting quantum dots do not include copper or manganese.

The blue light emitting quantum dots may have a shape of at least one of a sphere, a polygon, or a multipod. In an embodiment, the blue light emitting quantum dots may have a multipod shape. The multipod may have at least two (e.g., at least three or at least four) branch parts and a valley part therebetween. An average size of the core may be greater than or equal to about 2 nm, greater than or equal to about 3 nm, or greater than or equal to about 4 nm. The average size of the core may be less than or equal to about 6 nm, for example less than or equal to about 5 nm. The blue light emitting semiconductor nanocrystal may have a size (or an average size, hereinafter, referred to as a size) of greater than or equal to about 3 nm, for example, greater than or equal to about 4 nm, greater than or equal to about 5 nm, greater than or equal to about 6 nm, greater than or equal to about 7 nm, or greater than or equal to about 8 nm. The blue light emitting semiconductor nanocrystal may have a size of less than or equal to about 30 nm, for example, less than or equal to about 29 nm, less than or equal to about 28 nm, less than or equal to about 27 nm, less than or equal to about 26 nm, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, or less than or equal to about 12 nm.

The blue light emitting quantum dots may have quantum efficiency of greater than or equal to about 60%, for example, greater than or equal to about 61%, greater than or equal to about 62%, greater than or equal to about 63%, greater than or equal to about 64%, greater than or equal to about 65%, greater than or equal to about 66%, greater than or equal to about 67%, greater than or equal to about 68%, or greater than or equal to about 69%. The semiconductor nanocrystal may have quantum efficiency of greater than or equal to about 80%, greater than or equal to about 90%, greater than or equal to about 95%, greater than or equal to about 99%, or greater than or equal to about 100%.

The light source may emit blue light by including a layer including aforementioned blue light emitting quantum dots, and for example the first incident light emitted from the first element, the second incident light emitted from the second element, and the third emitted from the third element may be each independently blue light.

Figure 3:
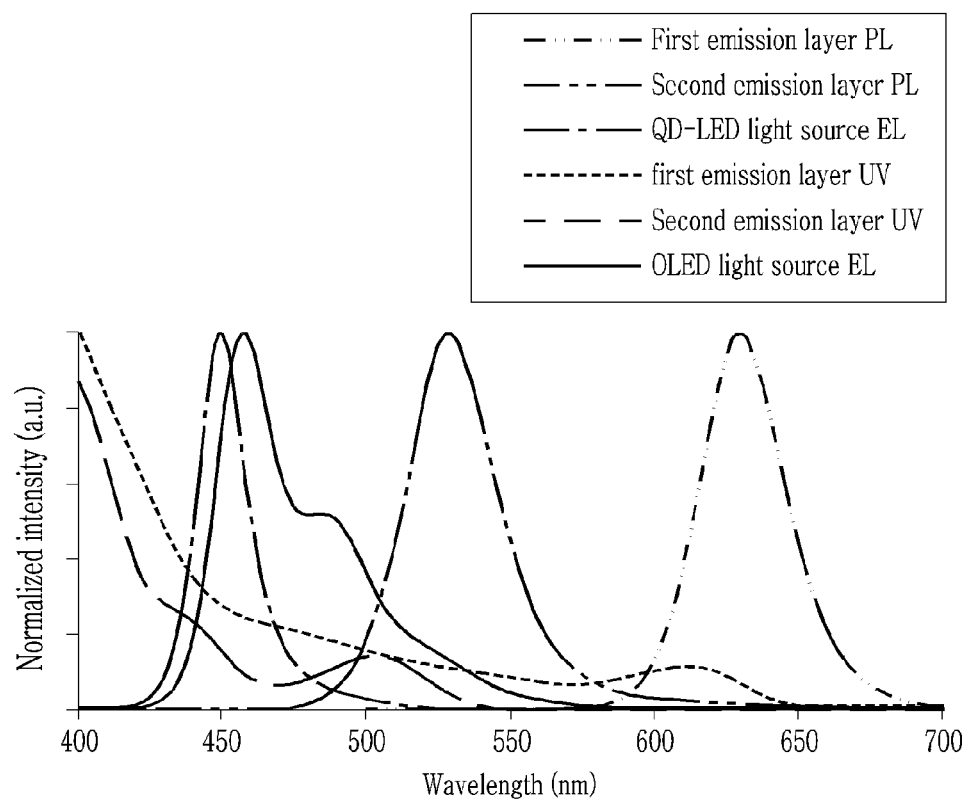
FIG. 3 is a graph of normalized intensity (arbitrary units (a.u.)) versus wavelength (nm) showing an electroluminescence (EL) emission spectrum of a layer comprising blue light emitting quantum dots, a photoluminescence (PL) emission spectrum and a ultraviolet (UV) spectrum of a first emission layer, a PL emission spectrum and a UV spectrum of a second emission layer, and an EL emission spectrum of a blue organic light emitting diode (OLED), in a display device according to an embodiment.

FIG. 3 shows an EL emission spectrum of a layer including blue light emitting quantum dots, a PL emission spectrum and a UV spectrum of a first emission layer, a PL emission spectrum and a UV spectrum of a second emission layer, and an EL emission spectrum of a blue OLED, in a display device according to an embodiment.

Referring to FIG. 3, since a blue light emitting organic fluorescent material has an asymmetric emission spectrum due to a wide full width at half maximum (FWHM) and a long wavelength tail phenomenon of a maximum emission peak (referred to be a long wavelength shoulder, tail phenomenon), in order to apply the organic fluorescent material as a blue light source to the display device, e.g., use the organic fluorescent material as a blue light source in the display device, and provide pure blue light, a resonance structure inside the device is desired. On the contrary, since the blue light emitting quantum dots have a narrow full width at half maximum (FWHM) and a symmetric maximum emission peak, the display device into which the aforementioned blue light emitting quantum dots are introduced as a light source may provide improved luminous efficiency and luminance.

For example, at least one of the first incident light, the second incident light, or the third light may have a maximum emission peak wavelength in a range of less than or equal to about 460 nm, less than or equal to about 458 nm, or less than or equal to about 455 nm, for example, in a range of about 430 nm to about 460 nm, about 430 nm to about 458 nm, about 430 nm to about 455 nm, about 435 nm to about 460 nm, about 435 nm to about 458 nm, about 435 nm to about 455 nm, about 440 nm to about 460 nm, about 440 nm to about 458 nm, or about 435 nm to about 455 nm.

For example, at least two of the first incident light, the second incident light, and the third light may have a maximum emission peak wavelength in a range of less than or equal to about 460 nm, less than or equal to about 458 nm, or less than or equal to about 455 nm, for example, in a range of about 430 nm to about 460 nm, about 430 nm to about 458 nm, about 430 nm to about 455 nm, about 435 nm to about 460 nm, about 435 nm to about 458 nm, about 435 nm to about 455 nm, about 440 nm to about 460 nm, about 440 nm to about 458 nm, or about 435 nm to about 455 nm.

For example, the first incident light, the second incident light, and the third light may each independently have a maximum emission peak wavelength in a range of less than or equal to about 460 nm, less than or equal to about 458 nm, or less than or equal to about 455 nm, for example, in a range of about 430 nm to about 460 nm, about 430 nm to about 458 nm, about 430 nm to about 455 nm, about 435 nm to about 460 nm, about 435 nm to about 458 nm, about 435 nm to about 455 nm, about 440 nm to about 460 nm, about 440 nm to about 458 nm, or about 435 nm to about 455 nm.

Referring to FIG. 3, as the first emission layer (including the red light emitting quantum dots which is described later) and the second emission layer (including the green light emitting quantum dots which is described later) absorb light of shorter wavelength, the UV-Vis absorption spectrum exhibits excellent intensity. Accordingly, as the first incident light and the second incident light have a maximum emission peak wavelength in a short wavelength range, the first emission layer and the second emission layer may exhibit higher luminous efficiency. Referring to FIG. 3, since the blue light emitting quantum dots according to an embodiment may have a maximum emission peak wavelength in a sufficient short wavelength range, the first emission layer and the second emission layer may exhibit higher luminous efficiency, and the display device according to an embodiment may exhibit excellent luminous efficiency and luminance. However, referring to FIG. 3, the organic fluorescent material emitting blue light (controls a maximum emission peak wavelength in a short wavelength range by adjusting a conjugated structure of organic molecules and thus) may not realize, e.g., exhibit, a maximum emission peak wavelength in a short wavelength range with high efficiency.

At least one of the first incident light, the second incident light, or the third light may have a full width at half maximum (FWHM) of the maximum emission peak of less than or equal to about 33 nm, less than or equal to about 30 nm, less than or equal to about 25 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm. For example, at least two of the first incident light, the second incident light, and the third light may have a full width at half maximum (FWHM) of less than or equal to about 33 nm, less than or equal to about 30 nm, less than or equal to about 25 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm. For example, the first incident light, the second incident light, and the third light may each independently have a full width at half maximum (FWHM) of full width at half maximum (FWHM)33 nm, less than or equal to about 30 nm, less than or equal to about 25 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm. Referring to FIG. 3, the blue light emitting quantum dots has a narrower full width at half maximum (FWHM) of a maximum emission peak than that of the organic fluorescent material and accordingly, when the blue light emitting quantum dots are introduced as a light source of a display device, may realize, e.g., exhibit, excellent color reproducibility. For example, when the maximum emission peak has a full width at half maximum (FWHM) within the disclosed ranges, a display device having excellent color reproducibility may be provided.

The first incident light, second incident light and third light may be the same or different from each other and for example, may have the same or different maximum emission peak wavelength, and may have the same or different full width at half maximum (FWHM).

Referring to FIG. 1, in the display device according to an embodiment, the first incident light, second incident light and third light may be all the same. For example, the first incident light, the second incident light, and the third light may have a maximum emission peak wavelength in a range of less than or equal to about 460 nm, less than or equal to about 458 nm, or less than or equal to about 455 nm, for example about 430 nm to about 460 nm, about 430 nm to about 458 nm, about 430 nm to about 455 nm, about 435 nm to about 460 nm, about 435 nm to about 458 nm, about 435 nm to about 455 nm, about 440 nm to about 460 nm, about 440 nm to about 458 nm, or about 440 nm to about 455 nm. For example, the first incident light, second incident light and third light may have a full width at half maximum (FWHM) of less than or equal to about 33 nm, less than or equal to about 30 nm, less than or equal to about 25 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 16 nm, or less than or equal to about 15 nm.

Figure 2:
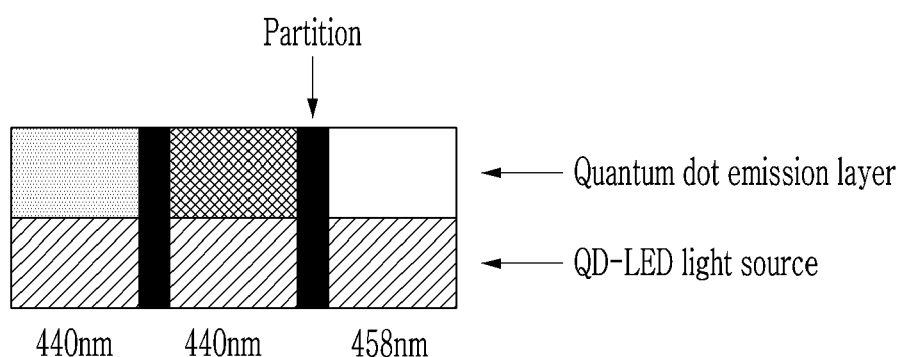
FIG. 2 shows a schematic cross-sectional view of a display device according to another embodiment.

Meanwhile, FIG. 2 shows a schematic cross-sectional view of a display device according to an embodiment.

In FIG. 2, the light source, the quantum dot emission layer, the partition wall, etc. are the same as mentioned above or later in the descriptions of FIG. 1.

Referring to FIG. 2, in the display device according to an embodiment, at least one of a first element, a second element, or a third element may be different from the others, for example, at least one of the blue light emitting quantum dots included in the first element, the blue light emitting quantum dots included in the second element, or the blue light emitting quantum dots included in the third element may be different from the others.

Referring to FIG. 2, in the display device according to an embodiment, the third element may differ from the first element, the third element may differ from the second element, and the first element may be the same as or different from the second element. For example, the blue light emitting quantum dots included in the third element may differ from the blue light emitting quantum dots included in the first element, the blue light emitting quantum dots included in the third element may differ from the blue light emitting quantum dots included in the second element, and the blue light emitting quantum dots included in the first element may differ from the blue light emitting quantum dots included in the second element.

Referring to FIG. 2, in the display device according to an embodiment, at least one of the first incident light, the second incident light, or the third light may differ from the others, for example, the third light may differ from the first incident light, the third light may differ from the second incident light, and the first incident light may be the same as or different from the second incident light.

For example, the maximum emission peak wavelength of the third light may differ from the maximum emission peak wavelength of the first incident light, and the maximum emission peak wavelength of the third light may differ from the maximum emission peak wavelength of the second incident light. For example, the maximum emission peak wavelength of the first incident light may be in a short wavelength range than the maximum emission peak wavelength of the third light, and the maximum emission peak wavelength of the second incident light may be in a short wavelength range than the maximum emission peak wavelength of the third light.

For example, the third light may have a maximum emission peak wavelength in a range of less than or equal to about 460 nm, less than or equal to about 458 nm, or less than or equal to about 455 nm and the first incident light and the second incident light may each independently have a maximum emission peak wavelength in a range of less than or equal to about 450 nm, less than or equal to about 445 nm, less than or equal to about 442 nm, or less than or equal to about 440 nm. For example, the third light may have a maximum emission peak wavelength in a range of greater than or equal to about 450 nm and less than or equal to about 460 nm, greater than or equal to about 450 nm and less than or equal to about 458 nm, greater than or equal to about 450 nm and less than or equal to about 455 nm, greater than or equal to about 452 nm and less than or equal to about 460 nm, greater than or equal to about 452 nm and less than or equal to about 458 nm, or greater than or equal to about 452 nm and less than or equal to about 455 nm and the first incident light and the second incident light may each independently have a maximum emission peak wavelength in a range of greater than or equal to about 430 nm and less than or equal to about 450 nm, greater than or equal to about 430 nm and less than or equal to about 445 nm, greater than or equal to about 430 nm and less than or equal to about 442 nm, greater than or equal to about 430 nm and less than or equal to about 440 nm, greater than or equal to about 430 nm and less than about 450 nm, greater than or equal to about 430 nm and less than about 445 nm, greater than or equal to about 430 nm and less than about 442 nm, or greater than or equal to about 430 nm and less than about 440 nm. Herein, the maximum emission peak wavelength of the first incident light and the maximum emission peak wavelength of the second incident light may be the same or different, and may be the same or different within the aforementioned ranges.

Figure 4:
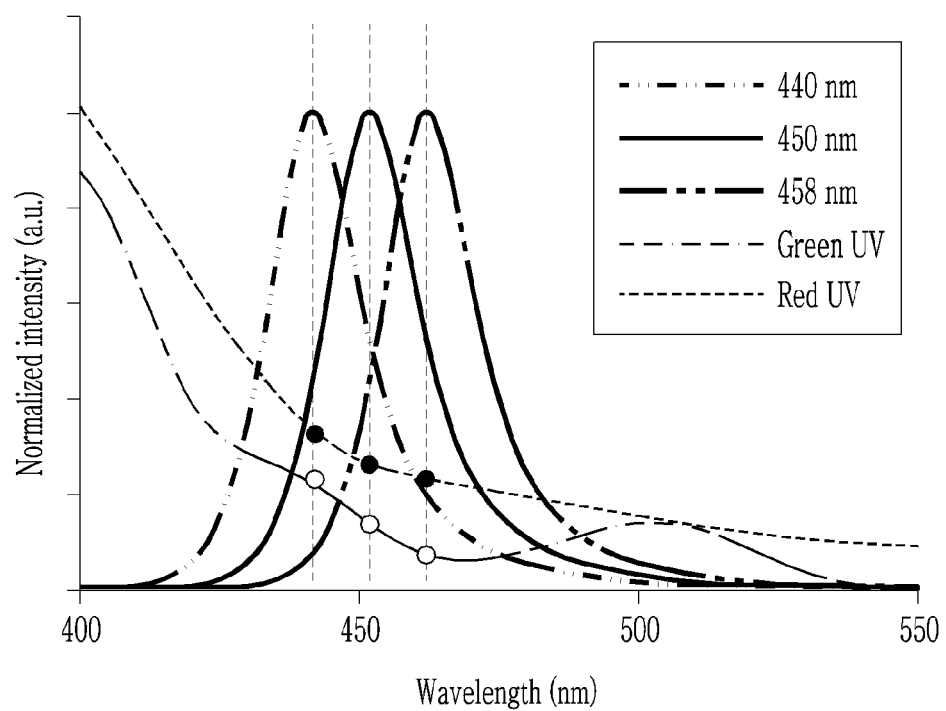
FIG. 4 is a graph of normalized intensity (a.u.) versus wavelength (nm) showing a UV-Vis absorption spectrum of a first emission layer, a UV-Vis absorption spectrum of a second emission layer, an EL emission spectrum of a layer including blue light emitting quantum dots that emit light of a wavelength of 440 nm, an EL emission spectrum of a layer including blue light emitting quantum dots that emit light of a wavelength of 450 nm, and an EL emission spectrum of a layer including blue light emitting quantum dots that emit light of a wavelength of 458 nm, in a display device according to an embodiment.

FIG. 4 shows a UV-Vis absorption spectrum of a first emission layer, a UV-Vis absorption spectrum of a second emission layer, an EL emission spectrum of a layer including blue light emitting quantum dots that emit light of a wavelength of 440 nm, an EL emission spectrum of a layer including blue light emitting quantum dots that emit light of a wavelength of 450 nm, and an EL emission spectrum of a layer including blue light emitting quantum dots that emit light of a wavelength of 458 nm, in a display device according to an embodiment.

Referring to FIGS. 3 and 4, as the first emission layer (including the red light emitting quantum dots which is described later) and the second emission layer (including the green light emitting quantum dots which is described later) absorb light of shorter wavelength, the UV-Vis absorption spectra exhibit excellent intensity. Accordingly, as the first incident light and the second incident light have a maximum emission peak wavelength in a shorter wavelength range, luminous efficiency of the first and second emission layers is higher. For example, when at least one of the maximum emission peak wavelength of the first incident light or the maximum emission peak wavelength of the second incident light (a shorter wavelength than that of the third light) is within the range, a display device having excellent luminous efficiency and luminance may be provided, and when the maximum emission peak wavelength of the third light is within the range, the display device may realize, e.g., display, an excellent image.

Although not shown in FIG. 1, the layer comprising the blue light emitting quantum dots may optionally further include green light emitting quantum dots. Accordingly, the light source may emit green light together with blue light, and the display device including the light source may realize, e.g., exhibit, excellent luminance by improving visibility. Herein, the structure and material of the green light emitting quantum dots (hereinafter, also referred to as green light emitting semiconductor nanocrystals) are not particularly limited. For example, at least one of the structure or material of the green light emitting quantum dots included in the layer comprising the blue light emitting quantum dots may be the same as or different from at least one of the structure or material of the green light emitting quantum dots included in the second emission layer which is described later.

The green light emitting quantum dots included in the layer including blue light emitting quantum dots may emit green light having a maximum emission peak wavelength in a range of less than or equal to about 600 nm, less than or equal to about 590 nm, less than or equal to about 580 nm, less than or equal to about 570 nm, less than or equal to about 560 nm, less than or equal to about 550 nm, less than or equal to about 540 nm, or less than or equal to about 535 nm. The green light may have a maximum emission peak wavelength in a range of about 500 nm to about 560 nm (e.g., greater than or equal to about 515 nm and less than or equal to about 535 nm) within the aforementioned ranges.

The green light emitting quantum dots included in the layer including blue light emitting quantum dots may be included in a small amount such that the light emitted from the light source can be recognized as blue light. For example, the green light emitting quantum dots included in the layer including the blue light emitting quantum dots may be included in an amount of less than or equal to about 10 wt %, for example, less than or equal to about 9 wt %, for example, less than or equal to about 8 wt %, for example, less than or equal to about 7 wt %, for example, less than or equal to about 6 wt %, for example, less than or equal to about 5 wt %, for example, less than or equal to about 4 wt %, for example, less than or equal to about 3 wt %, for example, less than or equal to about 2 wt %, for example, less than or equal to about 1 wt %, for example, less than or equal to about 0.5 wt %, based on the total weight of the blue light emitting quantum dots, but are not limited thereto; and may be adjusted and included within an appropriate range in order to realize, e.g., provide, higher luminance in consideration of the maximum emission peak wavelength, light emission efficiency, and the like, of the blue light emitting quantum dots and the green light emitting quantum dots. Accordingly, a display device including the light source may exhibit excellent luminous efficiency and color reproducibility, but also excellent luminance.

For example, each of the layers including blue light emitting quantum dots of the first element, the second element, and the third element may optionally further include green light emitting quantum dots.

For example, the layer including blue light emitting quantum dots of the third element may further include green light emitting quantum dots; for example, each of the first element and the second element may include two electrodes facing each other and a layer of blue light emitting quantum dots disposed between the two electrodes, and the third element may include two electrodes facing each other and a layer including blue light emitting quantum dots and green light emitting quantum dots disposed between the two electrodes. Herein, the layer of blue light emitting quantum dots refers to a layer that does not contain quantum dots other than the blue light-emitting quantum dots, for example, a layer that does not contain at least one of red light emitting quantum dots or green light emitting quantum dots.

Although not shown in FIG. 1, the blue light (e.g., the first incident light, the second incident light, and the third light), and optionally the green light, emitted from the layer including blue light emitting quantum dots may enter the quantum dot emission layer (after passing the light transmitting electrode) or be emitted inside or out of the display device (e.g., through a light transmittance layer which is described later).

Although not shown in FIG. 1, the light source may further include a charge (hole or electron) auxiliary layer between the two electrodes (e.g., anode and cathode). For example, the light source may include a hole auxiliary layer or an electron auxiliary layer between at least of the anode and the layer including blue light emitting quantum dots or the cathode and the layer including blue light emitting quantum dots.

The hole auxiliary layer may be, for example, at least one of a hole injection layer to facilitate injection of holes, a hole transport layer to facilitate transport of holes, or an electron blocking layer to block transport of electrons. For example, the hole injection layer may be disposed between the hole transport layer and the anode. For example, the electron blocking layer may be disposed between the layer including blue light emitting quantum dots and the hole transport (injection) layer, but is not limited thereto. The thickness of each layer may be selected appropriately. For example, the thickness of each layer may be greater than or equal to about 1 nm and less than or equal to about 500 nm, but is not limited thereto. The hole injection layer may be an organic layer that may be formed by a solution process (e.g., spin coating, etc.) such as poly(3,4-ethylenedioxythiophene):poly(styrenesulfonate) (PEDOT:PSS). The hole transport layer may also be an organic layer that may be formed by a solution process (e.g., spin coating, etc.).

The electron auxiliary layer may be, for example, at least one of an electron injection layer to facilitate injection of electrons, an electron transport layer to facilitate transport of electrons, or a hole blocking layer to block transport of holes. For example, the electron injection layer may be disposed between the electron transport layer and the cathode. For example, the hole blocking layer may be disposed between the layer including blue light emitting quantum dots and the electron transport layer, but is not limited thereto. The thickness of each layer may be selected appropriately. For example, the thickness of each layer may be greater than or equal to about 1 nm and less than or equal to about 500 nm, but is not limited thereto. The electron injection layer may be an organic layer that may be formed by deposition. The electron transport layer may be an organic layer including inorganic oxide nanoparticles or formed by deposition.

The layer including blue light emitting quantum dots may be disposed in, e.g., correspond to, the hole injection (or transport) layer or the electron injection (transport) layer. The layer including blue light emitting quantum dots may be disposed as a separate layer between the hole auxiliary layer and the electron auxiliary layer.

The charge auxiliary layer, the electron blocking layer, and the hole blocking layer may include for example an organic material, an inorganic material, or an organic/inorganic material. The organic material may be an organic compound having hole or electron related properties. The inorganic material may be a metal oxide such as a molybdenum oxide, a tungsten oxide, a zinc oxide, nickel oxide, but is not limited thereto.

At least one of the hole injection layer or the hole transport layer may include, for example, at least one of poly(3,4-ethylenedioxythiophene):poly(styrenesulfonate) (PEDOT:PSS), poly(9,9-dioctyl-fluorene-co-N-(4-butylphenyl)-diphenylamine) (TFB), polyarylamine, poly (N-vinylcarbazole) (PVK), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolylamino)phenylcyclohexane (TAPC), p-type metal oxide (e.g., NiO, $WO_3$, $MoO_3$, etc.), or a carbon-based material such as graphene oxide, but is not limited thereto. In an embodiment, the hole injection layer may include TFB or PVK. The TFB may have a weight average molecular weight of greater than or equal to about 50,000, for example, greater than or equal to about 60,000, greater than or equal to about 70,000, greater than or equal to about 80,000, or greater than or equal to about 90,000. In an embodiment, the hole injection layer may include PEDOT:PSS.

The electron blocking layer may include, for example, at least one of poly(3,4-ethylenedioxythiophene):poly(styrenesulfonate) (PEDOT:PSS), poly(9,9-dioctyl-fluorene-co-N-(4-butylphenyl)-diphenylamine) (TFB) polyarylamine, poly (N-vinylcarbazole, polyaniline, polypyrrole, N, N,N',N'-tetrakis(4-methoxyphenyl)-benzidine (TPD), 4-bis[N-(1-naphthyl)-N-phenyl-amino]biphenyl (α-NPD), m-MTDATA, or 4,4',4"-tris(N-carbazolyl)-triphenylamine (TCTA), but is not limited thereto.

At least one of the electron injection layer or the electron transport layer may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, tris(8-hydroxyquinolinato)aluminum ($Alq_3$), tris(8-hydroxyquinolinato)gallium ($Gaq_3$), tris(8-hydroxyquinolinato)indium ($Inq_3$), bis(8-hydroxyquinolinato) zinc ($Znq_2$), bis(2-(2-hydroxyphenyl)benzothiazolate) zinc ($Zn(BTZ)_2$), bis(10-hydroxybenzo[h]quinolinato)beryllium ($BeBq_2$), ET204 (8-(4-(4,6-di(naphthalen-2-yl)-1,3,5-triazin-2-yl)phenyl)quinolone), 8-hydroxyquinolinato lithium (Liq), an n-type organic semiconductor or n-type inorganic semiconductor (e.g., having a phosphine oxide group), for example, an n-type metal oxide (e.g., zinc oxide including magnesium as desired, $HfO_2$, etc.), or bathophenanthroline (Bphen), but is not limited thereto.

The hole blocking layer (HBL) may include, for example, at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, or $BeBq_2$, but is not limited thereto.

In a display device according to an embodiment, the light source may include an anode disposed on a transparent substrate, the anode being a transparent electrode, and at least one of PEDOT:PSS or p-type metal oxide, etc. as a hole injection layer (or hole transport layer) disposed between the anode and the layer including blue light emitting quantum dots. An electron auxiliary layer (e.g., electron transport layer) may be disposed between the cathode and the layer including blue light emitting quantum dots.

In a display device according to an embodiment, the light source may have an inverted structure. Herein, the cathode may be disposed on a transparent substrate, the cathode being a transparent electrode, and the anode facing the cathode may include a hole injection metal (e.g., Au, Ag, etc.) (of a relatively high work function). For example, an n-type metal oxide (ZnO) or the like may be disposed between the cathode and the layer including blue light emitting quantum dots as an electron auxiliary layer (e.g., electron transport layer). Between the metal anode and the layer including blue light emitting quantum dots, $MoO_3$ or other p-type metal oxide may be disposed as a hole auxiliary layer (e.g., hole transport layer).

Referring to FIG. 1, the display device according to an embodiment may include a quantum dot emission layer on or under the aforementioned light source. For example, the quantum dot emission layer may be disposed directly on or under the light source, or another element/member may be for example disposed between the light source and the quantum dot emission layer.

The blue light (e.g., at least one of the first incident light, the second incident light, or the third light), and optionally the green light, emitted from the aforementioned light source excites red light emitting quantum dots and green light emitting quantum dots in the quantum dot emission layer and respectively, emits red light (e.g., first light) and green light (e.g., second light), or inside or outside the display device through a light transmittance layer, described below. By including a photoluminescent type quantum dot emission layer, a wider viewing angle, improved luminance, and improved color reproducibility of the display device may be realized, e.g., provided, under the next-generation standard BT2020.

Referring to FIG. 1, the quantum dot emission layer may include a first emission layer disposed in, e.g., corresponding to, the red pixel, the red pixel being configured to emit red light (e.g., first light) and a second emission layer disposed in, e.g., corresponding to, the green pixel, the green pixel being configured to emit green light (e.g., second light). The first emission layer and the second emission layer may each independently be present, and for example the other portion (another element or member) may exist between the first emission layer and the second emission layer. For example, the display device may include a partition wall (also referred to as a pixel define layer) that optically isolates the first emission layer and the second emission layer between the first emission layer and the second emission layer. The first emission layer and the second emission layer may each independently be patterned to correspond to the red color pixel section and the green color pixel section. A patterning method is not particularly limited. For example, a patterning method may be a method of inkjet or screen printing a solution including red light emitting quantum dots, or green light emitting quantum dots, but is not limited thereto. At least one of the first emission layer or the second emission layer may be patterned by a method using photoresist. An example of the patterned method will be described later.

The first emission layer may include red light emitting quantum dots dispersed in the polymer matrix, and the first emission layer may absorb the first incident light and may emit red light, for example, first light by including red light emitting quantum dots. Further, the second emission layer may include green light emitting quantum dots dispersed in the polymer matrix, and the second emission layer may absorb the second incident light and may emit green light, for example, second light by including green light emitting quantum dots. The red light emitting quantum dots (hereinafter, also referred to as red light emitting semiconductor nanocrystals) and the green light emitting quantum dots (hereinafter, also referred to as green light emitting semiconductor nanocrystal) are not particularly limited and may, for example, be commercially available or may be synthesized through a chemical wet process. In the chemical wet method, crystal particles are grown by reacting precursor materials in an organic solvent, and organic solvent or ligand compound is naturally coordinated to a surface of the quantum dots to control a growth of crystals. The organic solvents and ligand compounds are not particularly limited.

The red light emitting quantum dots and the green light emitting quantum dots may include at least one of a Group II-VI compound or a Group III-V compound. In an embodiment, the red light emitting quantum dots and the green light emitting quantum dots do not include cadmium, mercury, or lead. Herein, the Group II-VI compound and the Group III-V compound are the same as mentioned above.

The red light emitting quantum dots and the green light emitting quantum dots may have a core/shell structure. Herein, in the core/shell, the interface between the core and the shell may have a concentration gradient structure in which concentrations of elements in the shell decreases toward the center. However, in an embodiment, in the red light emitting quantum dots and the green light emitting quantum dots, both core and shell do not include cadmium, lead, or mercury as described above.

The cores of the red light emitting quantum dots and the green light emitting quantum dots may include a Group III-V compound and may include, for example, indium, or phosphorus, for example, at least one of InP, GaP, InAs, GaAs, InSb, GaSb, InGaP, InAsP, or InSbP. In an embodiment, the cores of the red light emitting quantum dots and the green light emitting quantum dots do not include zinc.

In the red light emitting quantum dots and the green light emitting quantum dots, the size of the core may be appropriately selected in consideration of the optical light emitting wavelength. For example, the size of the core may be greater than or equal to about 2.5 nm, greater than or equal to about 2.6 nm, greater than or equal to about 2.7 nm, greater than or equal to about 2.8 nm, or greater than or equal to about 2.9 nm. For example, the size of the core may be less than or equal to about 4.5 nm, for example less than or equal to about 4 nm, or less than or equal to about 3.5 nm.

In the red light emitting quantum dots and the green light emitting quantum dots, the shell may include a first semiconductor nanocrystal shell including zinc and selenium. The shell may include a second semiconductor nanocrystal shell disposed on the first semiconductor nanocrystal shell and the second semiconductor nanocrystal shell may include zinc and sulfur. For example, the red light emitting quantum dots and the green light emitting quantum dots may include a core including indium phosphide (e.g., InP), and may have a core-multi-layered shell structure. For example, the red light emitting quantum dots and the green light emitting quantum dots may include a first semiconductor nanocrystal shell that is disposed directly on the core and includes at least one of ZnSe or ZnSeS. The red light emitting quantum dots and the green light emitting quantum dots may have a core-multi-layered shell structure in which a second semiconductor nanocrystal shell including at least one of ZnS or ZnSeS is disposed directly on the first semiconductor nanocrystal shell and have a different composition from the first semiconductor nanocrystal shell.

In the red light emitting quantum dots and the green light emitting quantum dots, the mole ratio of zinc relative to indium may be greater than or equal to about 10:1. The red light emitting quantum dots and the green light emitting quantum dots may include a coating (shell) of improved quality and increased thickness on the core, and the mole ratio of zinc to the indium may represent these characteristics. The mole ratio of zinc relative to indium may be greater than or equal to about 10.5:1, greater than or equal to about 11:1, greater than or equal to about 11.5:1, greater than or equal to about 12:1, or greater than or equal to about 12.5:1. The mole ratio of zinc relative to indium may be less than or equal to about 40:1, for example, less than or equal to about 35:1, less than or equal to about 30:1, less than or equal to about 25:1, less than or equal to about 24:1, less than or equal to about 23:1, less than or equal to about 22:1, less than or equal to about 21:1, less than or equal to about 20:1, or less than or equal to about 19.5:1.

In the red light emitting quantum dots and the green light emitting quantum dots, the first semiconductor nanocrystal shell may include ZnSe. In an embodiment, the first semiconductor nanocrystal shell does not include sulfur (S). For example, in an embodiment, the first semiconductor nanocrystal shell does not include ZnSeS. The first semiconductor nanocrystal shell may be disposed directly on the core. The first semiconductor nanocrystal shell may have a thickness of greater than or equal to 3 monolayers (ML), or greater than or equal to about 4 ML. The first semiconductor nanocrystal shell may have a thickness of less than or equal to 10 ML, for example, less than or equal to 9 ML, less than or equal to about 8 ML, or less than or equal to about 7 ML.

In the red light emitting quantum dots and the green light emitting quantum dots, a ratio of mole contents of selenium relative to indium may be greater than or equal to about 5.7:1, for example, greater than or equal to about 5.8:1, greater than or equal to about 5.9:1, greater than or equal to about 6.0:1, greater than or equal to about 6.1:1, greater than or equal to about 6.2:1, greater than or equal to about 6.3:1, greater than or equal to about 6.4:1, greater than or equal to about 6.5:1, greater than or equal to about 6.6:1, or greater than or equal to about 6.7:1. The ratio of mole contents of selenium relative to indium may be less than or equal to about 20:1, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, or less than or equal to about 10:1. Without being bound by any particular theory, the red light emitting quantum dots and the green light emitting quantum dots include a first semiconductor nanocrystal shell with a relatively increased thickness, so that the shell may provide a uniform shell formation and optical properties of the quantum dots (valley depth, half width and half maximum (HWHM), full width at half maximum (FWHM), etc.).

In the red light emitting quantum dots and the green light emitting quantum dots, the second semiconductor nanocrystal shell may be an outermost layer of the red light emitting quantum dots and the green light emitting quantum dots. The second semiconductor nanocrystal shell may be disposed directly on the first semiconductor nanocrystal shell. The second semiconductor nanocrystal shell may include at least one of ZnSeS or ZnS. In the red light emitting quantum dots and the green light emitting quantum dots, a ratio of contents of sulfur relative to indium may be greater than or equal to about 2:1, for example, greater than or equal to about 3:1, greater than or equal to about 3.1:1, greater than or equal to about 3.2:1, greater than or equal to about 3.4:1, greater than or equal to about 4:1, or greater than or equal to about 5:1. In the red light emitting quantum dots and the green light emitting quantum dots, the ratio of contents of sulfur relative to indium may be less than or equal to about 20:1, less than or equal to about 19:1, less than or equal to about 18:1, less than or equal to about 17:1, less than or equal to about 16:1, less than or equal to about 15:1, less than or equal to about 14:1, less than or equal to about 13:1, less than or equal to about 12:1, less than or equal to about 11:1, or less than or equal to about 10:1. In the red light emitting quantum dots and the green light emitting quantum dots, a mole ratio of selenium relative to sulfur may be greater than or equal to about 1:1, for example, greater than or equal to about 1.1:1, greater than or equal to about 1.2:1, greater than or equal to about 1.3:1, or greater than or equal to about 1.4:1. In the red light emitting quantum dots and the green light emitting quantum dots, the mole ratio of selenium relative to sulfur may be less than or equal to about 5:1, for example, less than or equal to about 4 about, less than or equal to about 3.5 about, or less than or equal to about 3 about.

In the red light emitting quantum dots and the green light emitting quantum dots, a mole ratio ((S+Se):In) of selenium and sulfur relative to indium may be greater than or equal to about 3:1, greater than or equal to about 4:1, greater than or equal to about 5:1, greater than or equal to about 6:1, greater than or equal to about 7:1, greater than or equal to about 8:1, greater than or equal to about 9:1, greater than or equal to about 10:1, greater than or equal to about 11:1, or greater than or equal to about 12:1. In the red light emitting quantum dots and the green light emitting quantum dots, the mole ratio ((S+Se):In) of selenium and sulfur relative to indium may be less than or equal to about 40:1, less than or equal to about 35:1, less than or equal to about 30:1, less than or equal to about 25:1, less than or equal to about 24:1, less than or equal to about 23:1, less than or equal to about 22:1, less than or equal to about 21:1, less than or equal to about 20:1, less than or equal to about 19:1, or less than or equal to about 18:1.

The sizes of the red light emitting quantum dots and the green light emitting quantum dots may be greater than or equal to about 6 nm, for example, greater than or equal to about 6.5 nm, greater than or equal to about 7.0 nm, greater than or equal to about 7.5 nm, greater than or equal to about 7.6 nm, greater than or equal to about 7.7 nm, greater than or equal to about 7.8 nm, greater than or equal to about 7.9 nm, or greater than or equal to about 8.0 nm. The sizes of the red light emitting quantum dots and the green light emitting quantum dots may be less than or equal to about 20 nm, for example, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm. The sizes of the red light emitting quantum dots and the green light emitting quantum dots may be particle diameters. The sizes of the red light emitting quantum dots and the green light emitting quantum dots (that do not have spherical shapes) may be diameters calculated by converting two-dimensional areas identified by transmission electron microscope analysis into circles. Herein, the sizes may mean the sizes of a single particle or the average sizes of the particles.

The red light emitting quantum dots and the green light emitting quantum dots are not limited to particular shapes, and may have, for example, a shape of at least one of a sphere, a polyhedron, a pyramid, a multipod, a cube, a nanotube, a nanowire, a nanofiber, or a nanosheet, but is not limited thereto. The quantum dot may include at least one of an organic ligand or an organic solvent on a surface thereof. At least one of the organic ligand or the organic solvent may be bound to surfaces of the quantum dots.

The red light emitting quantum dots and the green light emitting quantum dots may be formed of the same or different materials and may have the same or different sizes. For example, the red light emitting quantum dots and the green light emitting quantum dots may be formed of the same materials and may have different sizes, or may be formed of different materials and may have the same sizes. For example, the red light emitting quantum dots and the green light emitting quantum dots may be formed of the same materials, but the red light emitting quantum dots may have a larger size than the green light emitting quantum dots.

For application to display devices, the red light emitting quantum dots and the green light emitting quantum dots may be dispersed in the polymer matrix to form a quantum dot-polymer composite as described above. The aforementioned red light emitting quantum dots and green light emitting quantum dots have improved optical properties, and when included in a display device in the form of a quantum dot-polymer composite or a pattern, improved luminance, a wide viewing angle, and color reproducibility may be implemented.

The polymer matrix may each independently include at least one of a cross-linking polymer or a binder polymer. The cross-linking polymer may include at least one of a thiol-ene resin, a cross-linked poly(meth)acrylate, a cross-linked polyurethane, a cross-linked epoxy resin, a cross-linked vinyl polymer, or a cross-linked silicone resin. The cross-linking polymer may include at least one of a polymerization product of a photopolymerizable monomer having a carbon-carbon double bond or a polymerization product of the photopolymerizable monomer and a multiple thiol compound having at least two thiol groups at a terminal end thereof.

The binder polymer may include a carboxylic acid group. The binder polymer may include at least one of a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group; or a multiple aromatic ring-containing polymer having a backbone structure where two aromatic rings are bound to a quaternary carbon atom that is a constituent atom of another cyclic moiety in the main chain and including a carboxylic acid group (—COOH).

Specific examples of the first monomer may include carbonic acid vinyl ester compounds such as acrylic acid, methacrylic acid, maleic acid, itaconic acid, fumaric acid, 3-butanoic acid, vinyl acetate, vinyl benzoate, and the like, but are not limited thereto. The first monomer may be one or more compounds.

Specific examples of the second monomer may be alkenyl aromatic compounds such as styrene, alpha-methyl styrene, vinyl toluene, vinyl benzyl methyl ether, and the like; unsaturated carbonic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, phenyl methacrylate, and the like; unsaturated carbonic acid amino alkyl ester compounds such as 2-amino ethyl acrylate, 2-amino ethyl methacrylate, 2-dimethyl amino ethyl acrylate, 2-dimethyl amino ethyl methacrylate, and the like; maleimides such as N-phenylmaleimide, N-benzylmaleimide, or N-alkylmaleimide; unsaturated carbonic acid glycidyl ester compounds such as glycidyl acrylate, glycidyl methacrylate, and the like; vinyl cyanide compounds such as acrylonitrile, methacrylonitrile, and the like; unsaturated amide compounds such as acryl amide, methacryl amide, and the like, but are not limited thereto. The second monomer may be one or more compounds.

Specific examples of the third monomer may include 2-hydroxy ethyl acrylate, 2-hydroxy ethyl methacrylate, 2-hydroxy butyl acrylate, or 2-hydroxy butyl methacrylate, but are not limited thereto. The third monomer may be one or more compounds.

In the binder polymer, a content of a repeating unit derived from the first monomer may be greater than or equal to about 10 mole percent (mol %), for example, greater than or equal to about 15 mol %, greater than or equal to about 25 mol %, or greater than or equal to about 35 mol %, based on the total number of moles of repeating units derived from the first monomer, repeating units derived from the second monomer, and repeating units derived from the third monomer in the binder polymer. In the binder polymer, the content of the repeating unit derived from the first monomer may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on the total number of moles of repeating units derived from the first monomer, repeating units derived from the second monomer, and repeating units derived from the third monomer in the binder polymer.

In the binder polymer, a content of a repeating unit derived from the second monomer may be greater than or equal to about 10 mol %, for example, greater than or equal to about 15 mol %, greater than or equal to about 25 mol %, or greater than or equal to about 35 mol %, based on the total number of moles of repeating units derived from the first monomer, repeating units derived from the second monomer, and repeating units derived from the third monomer in the binder polymer. In the binder polymer, a content of the repeating unit derived from the second monomer may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %, based on the total number of moles of repeating units derived from the first monomer, repeating units derived from the second monomer, and repeating units derived from the third monomer in the binder polymer.

In the binder polymer, if present, a content of a repeating unit derived from the third monomer may be greater than or equal to about 1 mol %, for example, greater than or equal to about 5 mol %, greater than or equal to about 10 mol %, or greater than or equal to about 15 mol %, based on the total number of moles of repeating units derived from the first monomer, repeating units derived from the second monomer, and repeating units derived from the third monomer in the binder polymer. In the binder polymer, the content of the repeating unit derived from the third monomer may be less than or equal to about 30 mol %, for example, less than or equal to about 25 mol %, less than or equal to about 20 mol %, less than or equal to about 18 mol %, less than or equal to about 15 mol %, or less than or equal to about 10 mol %, based on the total number of moles of repeating units derived from the first monomer, repeating units derived from the second monomer, and repeating units derived from the third monomer in the binder polymer.

The binder polymer may be a copolymer of (meth)acrylic acid; and at least one second/third monomer of arylalkyl (meth)acrylate, hydroxyalkyl (meth)acrylate, and styrene. For example, the binder polymer may be a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

The binder polymer including the carboxylic acid group may include a multiple aromatic ring-containing polymer. The multiple aromatic ring-containing polymer is known as a cardo binder resin and may be synthesized or commercially available (e.g., from Nippon Steel Chemical Co., Ltd.).

The binder polymer including the carboxylic acid group may have an acid value of greater than or equal to about 50 milligrams of potassium hydroxide per gram (mg KOH/g). For example, the binder polymer including the carboxylic acid group may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the binder polymer including the carboxylic acid group may be, for example, less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., including the carboxylic acid group) may have a weight average molecular weight of greater than or equal to about 1,000 grams per mole (g/mol), for example, greater than or equal to about 2,000 g/mol, greater than or equal to about 3,000 g/mol, or greater than or equal to about 5,000 g/mol. The weight average molecular weight of the binder polymer may be less than or equal to about 100,000 g/mol, for example, less than or equal to about 50,000 g/mol.

The photopolymerizable monomer including the carbon-carbon double bond may include the photopolymerizable acryl-based monomer. The photopolymerizable acryl-based monomer may include at least one of alkyl(meth)acrylate, ethylene glycoldi(meth)acrylate, triethylene glycoldi(meth)acrylate, diethylene glycoldi(meth)acrylate, 1,4-butanedioldi(meth)acrylate, 1,6-hexanedioldi(meth)acrylate, neopentylglycoldi(meth)acrylate, pentaerythritoldi(meth)acrylate, pentaerythritoltri(meth)acrylate, pentaerythritoltetra(meth)acrylate, dipentaerythritoldi(meth)acrylate, dipentaerythritoltri(meth)acrylate, dipentaerythritolpenta(meth)acrylate, pentaerythritolhexa(meth)acrylate, bisphenol A di(meth)acrylate, bisphenol A epoxyacrylate, trimethylolpropanetri(meth)acrylate, ethylene glycolmonomethylether (meth)acrylate, novolac epoxy (meth)acrylate, diethylene glycoldi(meth)acrylate, triethylene glycoldi(meth)acrylate, or propylene glycoldi(meth)acrylate, tris(meth)acryloyloxyethyl phosphate.

The multiple thiol compound may include at least one of a dithiol compound, a trithiol compound, or a tetrathiol compound. For example, the multiple thiol compound may include at least one of glycol di-3-mercaptopropionate, glycol dimercapto acetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propane dithiol, 1,2-ethane dithiol, or a polyethylene glycol dithiol including 1 to 10 ethylene glycol repeating units.

The polymer matrix may further include a metal oxide particulate and the metal oxide particulate may include at least one of $TiO_2$, $SiO_2$, $BaTiO_3$, $Ba_2TiO_4$, or ZnO.

The polymer matrix may further include moieties derived from various additives such as a (photo) initiator, a light diffusing agent, a leveling agent, a coupling agent, and the like. The additives may be any suitable compound or material having desired functionality and is not particularly limited.

Accordingly, the quantum dot emission layer (i.e., the first emission layer and the second emission layer) may be in the form of a film. The film may have, for example, a thickness of less than or equal to about 30 μm, for example, less than or equal to about 10 μm, less than or equal to about 8 μm, or less than or equal to about 7 μm and greater than about 2 μm, for example, greater than or equal to about 3 μm, greater than or equal to about 3.5 μm, or greater than or equal to about 4 μm. The first emission layer and the second emission layer may exhibit improved thermal stability. When the first emission layer and the second emission layer are heat-treated at 180° C. for 30 minutes under a nitrogen atmosphere, the light conversion efficiency (PCE) may be greater than or equal to about 20%.

The first emission layer includes a plurality of red light emitting quantum dots that are dispersed in the polymer matrix, thereby absorbing the first incident light provided by the first element of the light source and then emitting the first light that is the red light. For example, the maximum emission peak of the first light wavelength may be present in a range of greater than or equal to about 600 nm, greater than or equal to about 610 nm, greater than or equal to about 620 nm, greater than or equal to about 625 nm, or greater than or equal to about 630 nm, for example, greater than or equal to about 600 nm and less than or equal to about 650 nm, greater than or equal to about 610 nm and less than or equal to about 650 nm, greater than or equal to about 620 nm and less than or equal to about 650 nm, greater than or equal to about 625 nm and less than or equal to about 650 nm, greater than or equal to about 630 nm and less than or equal to about 650 nm, greater than or equal to about 600 nm and less than or equal to about 640 nm, greater than or equal to about 610 nm and less than or equal to about 640 nm, greater than or equal to about 620 nm and less than or equal to about 640 nm, greater than or equal to about 625 nm and less than or equal to about 640 nm, or greater than or equal to about 630 nm and less than or equal to about 640 nm.

The second emission layer includes a plurality of green light emitting quantum dots that are dispersed in the polymer matrix, thereby absorbing the second incident light provided by the second element of the light source and then emitting the second light that is the green light. For example, the maximum emission peak wavelength of the second light may be in a range of less than or equal to about 545 nm, less than or equal to about 543 nm, less than or equal to about 540 nm, less than or equal to about 538 nm, less than or equal to about 535 nm, less than or equal to about 533 nm, less than or equal to about 531 nm, or less than or equal to about 530 nm, for example in a range of greater than or equal to about 520 nm and less than or equal to about 545 nm, greater than or equal to about 520 nm and less than or equal to about 543 nm, greater than or equal to about 520 nm and less than or equal to about 540 nm, greater than or equal to about 520 nm and less than or equal to about 538 nm, greater than or equal to about 520 nm and less than or equal to about 535 nm, greater than or equal to about 520 nm and less than or equal to about 533 nm, greater than or equal to about 520 nm and less than or equal to about 531 nm, greater than or equal to about 520 nm and less than or equal to about 530 nm, greater than or equal to about 524 nm and less than or equal to about 545 nm, greater than or equal to about 524 nm and less than or equal to about 543 nm, greater than or equal to about 524 nm and less than or equal to about 540 nm, greater than or equal to about 524 nm and less than or equal to about 538 nm, greater than or equal to about 524 nm and less than or equal to about 535 nm, greater than or equal to about 524 nm and less than or equal to about 533 nm, greater than or equal to about 524 nm and less than or equal to about 531 nm, greater than or equal to about 524 nm and less than or equal to about 530 nm, greater than or equal to about 526 nm and less than or equal to about 545 nm, greater than or equal to about 526 nm and less than or equal to about 543 nm, greater than or equal to about 526 nm and less than or equal to about 540 nm, greater than or equal to about 526 nm and less than or equal to about 538 nm, greater than or equal to about 526 nm and less than or equal to about 535 nm, greater than or equal to about 526 nm and less than or equal to about 533 nm, greater than or equal to about 526 nm and less than or equal to about 531 nm, greater than or equal to about 526 nm and less than or equal to about 530 nm, greater than or equal to about 527 nm and less than or equal to about 545 nm, greater than or equal to about 527 nm and less than or equal to about 543 nm, greater than or equal to about 527 nm and less than or equal to about 540 nm, greater than or equal to about 527 nm and less than or equal to about 538 nm, greater than or equal to about 527 nm and less than or equal to about 535 nm, greater than or equal to about 527 nm and less than or equal to about 533 nm, greater than or equal to about 527 nm and less than or equal to about 531 nm, or less than or equal to about 527 nm and less than or equal to about 530 nm. When the maximum emission peak wavelength of the second light is in the disclosed ranges, color reproducibility can provide a better display device.

At least one of the maximum emission peak of the first light or the maximum emission peak of the second light may have a full width at half maximum (FWHM) of less than or equal to about 45 nm, less than or equal to about 43 nm, less than or equal to about 40 nm, less than or equal to about 38 nm, less than or equal to about 37 nm, less than or equal to about 36 nm, or less than or equal to about 35 nm, and for example, the maximum emission peak of the first light and the maximum emission peak of the second light may each independently have a full width at half maximum (FWHM) of less than or equal to about 45 nm, less than or equal to about 43 nm, less than or equal to about 40 nm, less than or equal to about 38 nm, less than or equal to about 37 nm, less than or equal to about 36 nm, or less than or equal to about 35 nm. When the full width at half maximum (FWHM) of the maximum emission peak is in the disclosed ranges, a display device having improved color reproducibility may be provided.

A ratio ($S_{RG}:A_R$ or $S_{RG}:A_G$) of an overlapping area ($S_{RG}$) between a total area ($A_R$) of an emission spectrum of the first light and a total area ($A_G$) of an emission spectrum of the second light may be less than or equal to about 0.1:1, less than or equal to about 0.08:1, or less than or equal to about 0.07:1, for example, greater than or equal to about 0.01:1, greater than or equal to about 0.015:1, or greater than or equal to about 0.02:1 (e.g., with reference to a normalized spectrum). Stated otherwise, a ratio of an overlapping area of an emission spectrum of the first (e.g., red) light and an emission spectrum of the second (e.g., green) light ($S_{RG}$) to a total area of the emission spectrum of the first (e.g., red) light ($A_R$) may be less than or equal to about 0.1:1 or a ratio of the overlapping area ($S_{RG}$) to a total area of the emission spectrum of the second (e.g., green) light ($A_G$) may be less than or equal to about 0.1:1. When the ratio ($S_{RG}:A_R$ or $S_{RG}:A_G$) is within the disclosed ranges, a display device having improved color reproducibility and luminance may be provided.

A ratio ($S_{GB}:A_G$ or $S_{GB}:A_B$) of an overlapping area ($S_{GB}$) between a total area ($A_G$) of an emission spectrum of the second light and a total area ($A_B$) of an emission spectrum of the third light may be less than or equal to about 0.1:1, less than or equal to about 0.08:1, or less than or equal to about 0.07:1, for example, greater than or equal to about 0.01:1, greater than or equal to about 0.015:1, or greater than or equal to about 0.02:1 (e.g., with reference to a normalized spectrum). Stated otherwise, a ratio of an overlapping area of an emission spectrum of the second (e.g., green) light and an emission spectrum of the third (e.g., blue) light ($S_{GB}$) to a total area of the emission spectrum of the second (e.g., green) light ($A_G$) may be less than or equal to about 0.1:1 or a ratio of the overlapping area ($S_{GB}$) to a total area of the emission spectrum of the third (e.g., blue) light ($A_B$) may be less than or equal to about 0.1:1. When the ratio ($S_{GB}:A_G$ or $S_{GB}:A_B$) is within the disclosed ranges, a resonance structure of the device according to an embodiment may not be desired or necessary, and thus a display device having improved luminous efficiency and luminance may be provided.

In a UV-Vis absorption spectrum of the red light emitting quantum dots, a ratio ($I_{R,440}:I_{R,458}$) between an absorption intensity ($I_{R,440}$) at a wavelength of 440 nm and an absorption intensity ($I_{R,458}$) at a wavelength of 458 nm may be greater than or equal to about 1.0:1, greater than or equal to about 1.1:1, greater than or equal to about 1.2:1, greater than or equal to about 1.3:1, greater than or equal to about 1.4:1, or greater than or equal to about 1.5:1, and may be for example, less than or equal to about 10:1, less than or equal to about 9:1, less than or equal to about 8:1, or less than or equal to about 7.5:1. When the $I_{R,440}:I_{R,458}$ is within the disclosed ranges, a display device having improved luminous efficiency and luminance may be provided.

In a UV-Vis absorption spectrum of the green light emitting quantum dots, a ratio ($I_{G,440}:I_{G,458}$) between an absorption intensity ($I_{G,440}$) at a wavelength of 440 nm and an absorption intensity ($I_{G,458}$) at a wavelength of 458 nm may be greater than or equal to about 1.3:1, greater than or equal to about 1.8:1, greater than or equal to about 2.1:1, greater than or equal to about 2.4:1, greater than or equal to about 2.5:1, greater than or equal to about 2.6:1, greater than or equal to about 2.7:1, or greater than or equal to about 2.8:1 and may be, for example, less than or equal to about 20:1, less than or equal to about 18:1, less than or equal to about 16:1, less than or equal to about 15:1, or less than or equal to about 14:1. When the $I_{G,440}:I_{G,458}$ ratio is within the disclosed ranges, a display device having improved absorption rate of blue light (e.g., the first incident light and the second incident light), color reproducibility, and luminance may be provided.

Referring to FIG. 1, the display device may further include a light transmittance layer disposed in, e.g., corresponding to, the blue pixel and configured to transmit third light provided from the third element. The light transmittance layer may be disposed in, e.g., correspond to, the blue color pixel at a predetermined position corresponding to the aforementioned first emission layer in the red color pixel and the aforementioned second emission layer in the green color pixel. For example, the light transmittance layer may exist separately from the first emission layer and the second emission layer. Another portion (another element or member) may exist between the light transmittance layer and the first emission layer and for example, another portion (another element or member) may exist between the light transmittance layer and the second emission layer. For example, a partition wall (also referred to as a pixel define layer) may be included between the light transmittance layer and the first emission layer to optically isolate the light transmittance layer and the first emission layer. For example, a partition wall (also referred to as a pixel define layer) may be included between the light transmittance layer and the second emission layer to optically isolate the light transmittance layer and the second emission layer. The light transmittance layer, the first emission layer, and the second emission layer may each independently be patterned to correspond to the blue color pixel section, the red color pixel section, and the green color pixel section. A patterning method is not particularly limited, but may be a method for example inkjet or screen printing, but is not limited thereto. At least one of the light transmittance layer, the first emission layer, or the second emission layer may be patterned by a method using photoresist. An example of the patterned method will be described later.

Although not shown in FIG. 1, the display device may include a stacked structure in which a (e.g., transparent) second substrate and a quantum dot emission layer disposed on the second substrate as a light emitting element (e.g., photoluminescence element). In the stacked structure, the quantum dot emission layer may include a pattern of the quantum dot-polymer composite and the pattern may include at least one repeating section configured to emit light of a predetermined wavelength. The pattern of the quantum dot-polymer composite may include at least one repeating section (section) of a first section (red pixel) configured to emit a first light or a second section (green pixel) configured to emit a second light.

The quantum dot emission layer may have a light emitting wavelength ranging from about 510 nm to about 700 nm in the photoluminescence spectrum. The maximum emission peak wavelengths of the first light and the second light emitted from the quantum dot emission layer may differ in the photoluminescence spectrum. The full width at half maximum (FWHM) of the maximum emission peak may be the same or different, specifically is the same as described above.

The second substrate may include an insulating material. The second substrate may include a material of at least one of glass; at least one polymer such as a polyester (e.g., polyethylene terephthalate (PET), polyethylene naphthalate (PEN), or the like), a polycarbonate, a poly(meth)acrylate, a polyimide, a polyamide at least one of a copolymer or a mixture thereof; a polysiloxane (e.g., polydimethylsiloxane (PDMS)); or an inorganic material such as $Al_2O_3$ or ZnO; but is not limited thereto. A thickness of the second substrate may be appropriately selected taking into consideration the materials of the second substrate but is not particularly limited. The second substrate may have flexibility. The second substrate may be configured to have a transmittance for light emitted from the quantum dot emission layer and the light source of greater than or equal to about 50%, greater than or equal to about 60%, greater than or equal to about 70%, greater than or equal to about 80%, or greater than or equal to about 90%.

Although not shown in FIG. 1, at least a portion of the second substrate may be configured to block (e.g., absorb or reflect) blue light. A layer (blue light blocking layer) may be disposed at least a portion of the surfaces of the second substrate and may be patterned to correspond to the red and green color pixels. For example, the blue light blocking layer may include an organic material (e.g., polymer) and a predetermined dye (a yellow dye or a dye that transmits green/red light and absorbs blue light), but is not limited thereto.

In the display device according to an embodiment, color reproducibility of, e.g., according to, the BT2020 standard may be greater than or equal to about 85%, greater than or equal to about 87%, greater than or equal to about 88%, greater than or equal to about 89%, or greater than or equal to about 90%.

A method of manufacturing a stacked structure including the aforementioned quantum dot emission layer includes forming a film of a polymer matrix in which the aforementioned red light emitting quantum dot or green light emitting quantum dot is dispersed, on second substrate;

exposing selected regions of the film to light (e.g., wavelength of less than or equal to about 400 nm); and developing the exposed film with an alkali developing solution to obtain the pattern of the quantum dot emission layer.

Figure 5:
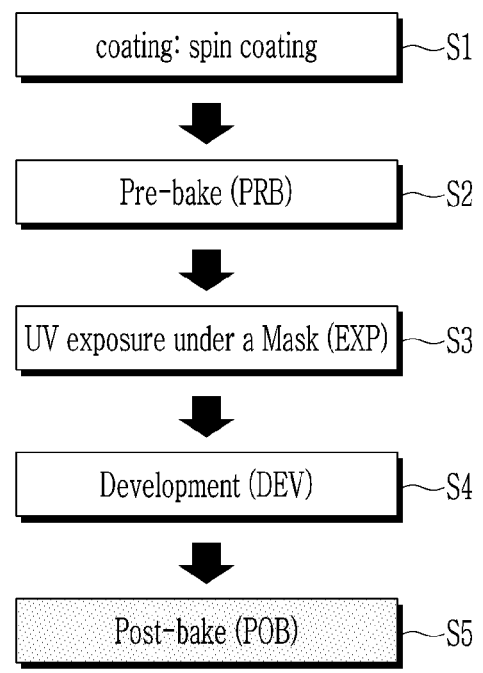
FIG. 5 shows a process for manufacturing a pattern of a quantum dot emission layer in a display device according to an embodiment.
Figure 5:
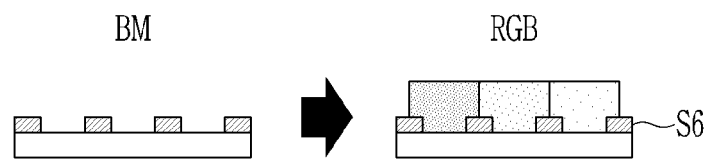

The second substrate and the polymer matrix in which the red light emitting quantum dot and green light emitting quantum dot are dispersed are the same as described above. A non-limiting method for pattern formation is explained referring to FIG. 5.

A film of the polymer matrix in which the aforementioned red light emitting quantum dot or green light emitting quantum dot are dispersed is formed with a predetermined thickness on the second substrate using an appropriate method of a spin coating, a slit coating, and the like. The formed film may be, optionally, pre-baked (PRB). The pre-baking may be performed by selecting an appropriate condition from conditions of a temperature, time, an atmosphere, and the like.

The formed (or optionally pre-baked) film is exposed to light having a predetermined wavelength under a mask having a predetermined pattern. A wavelength and intensity of the light may be selected taking into consideration types and contents of the photoinitiator, types and contents of the quantum dots, and the like.

The exposed film is treated with an alkali developing solution (e.g., dipping or spraying) to dissolve an unexposed region and obtain a desired pattern. The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes).

When the quantum dot-polymer composite pattern has a plurality of repetitive sections, a quantum dot emission layer having a desired pattern may be obtained by preparing a plurality of compositions including quantum dots having desired photoluminescence properties (a photoluminescence peak wavelength, etc.) to form each repeating section (e.g., a red light emitting quantum dot, a green quantum dot, or optionally, a blue quantum dot) and repeating formation of the pattern using each composition an appropriate number of times (e.g., twice or more or three times or more).

In an embodiment, an ink composition including a population of the aforementioned red light emitting quantum dots or green light emitting quantum dots and a liquid vehicle may be used for pattern formation. For example, ink including nanomaterials (e.g., red light emitting quantum dots or green light emitting quantum dots) and liquid vehicles, monomers, etc. is deposited on a desired region of the substrate and optionally at least one of liquid vehicles are removed or polymerization is performed to form a pattern.

For example, the quantum dot emission layer may be a pattern in which at least two different color sections (e.g., RGB color sections) are repeated.

In an embodiment, the display device includes the quantum dot emission layer including the light source and the stacked structure. The light source is the same as described above and may be configured to provide incident light to the light emitting element including the stacked structure.

Figure 6:
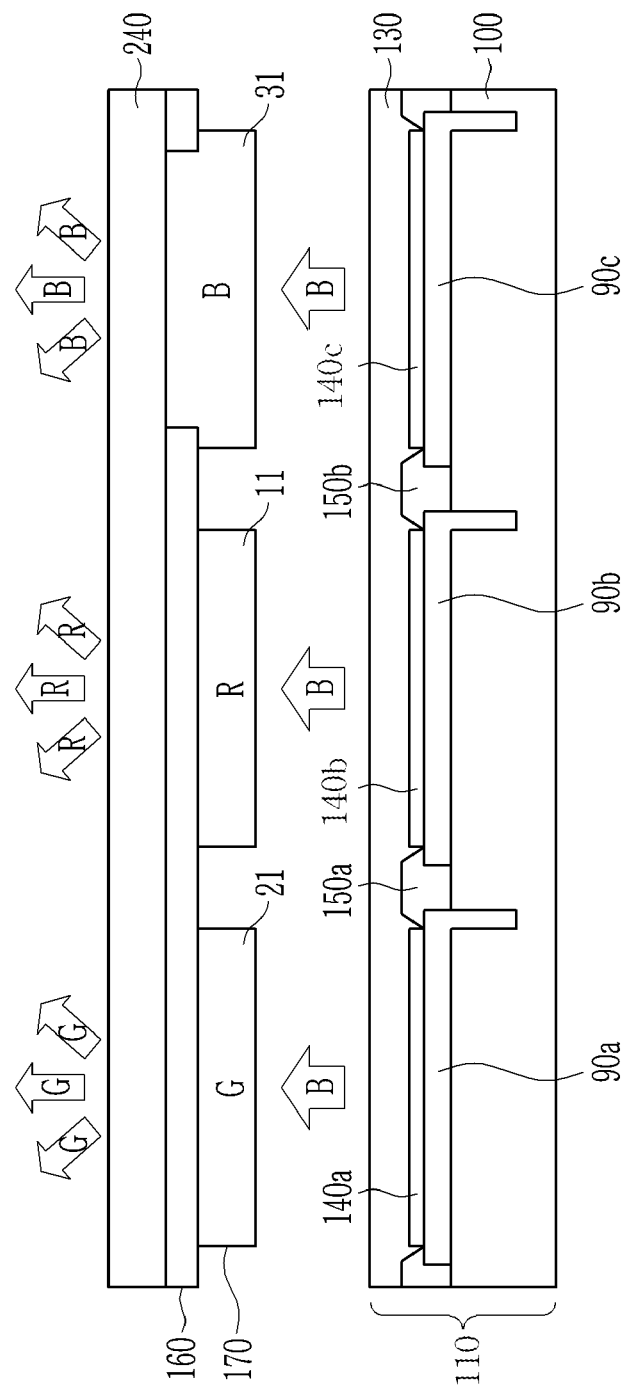
FIG. 6 shows a schematic cross-sectional view of a display device according to an embodiment.
Figure 7:
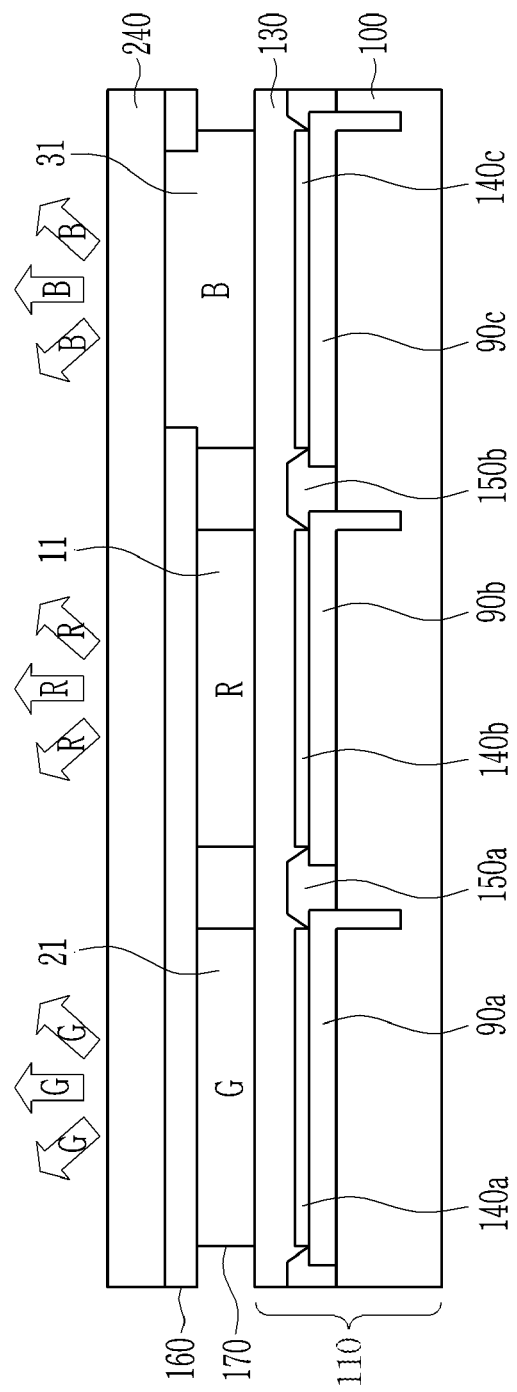
FIG. 7 shows a schematic cross-sectional view of a display device according to an embodiment.

FIG. 6 shows a schematic cross-sectional view of a display device according to an embodiment. FIG. 7 shows a schematic cross-sectional view of a display device according to an embodiment. Referring to FIGS. 6 and 7, the light source 110 includes two electrodes facing each other and a layer including blue light emitting quantum dots 140a, 140, 140c between the electrodes as described above and for example, the two electrodes facing each other may be a pixel electrode 90a, 90b, 90c and a common electrode 130. For example, the display device may include two or more pixel electrodes 90a, 90b, 90c formed on the first substrate 100, a pixel define layer 150a, 150b formed between the neighboring pixel electrodes 90a, 90b, 90c, and a layer including blue light emitting quantum dots 140a, 140, 140c formed on each pixel electrode 90a, 90b, 90c, and the common electrode 130 formed on the layer of the blue light emitting quantum dots 140a, 140, 140c.

A thin film transistor may be disposed under the light source 110. The first element, second element, and third elements of the light source 110 may be disposed to correspond to red pixel, green pixel, and blue pixel sections, respectively, as described above.

The stacked structure including a pattern of the aforementioned quantum dot emission layer 170 (e.g., a first emission layer 11 including red light emitting quantum dot and a second emission layer 21 including green light emitting quantum dots) and the second substrate 240, or the quantum dot emission layer 170 may be disposed on the light source 110 (e.g., directly on the light source 110).

As described above, the first incident light emitted from the first element of the light source 110 is incident on the first emission layer 11 of the quantum dot emission layer 170 to emit the first light and the second incident light emitted from the second element of the light source 110 is incident on the second emission layer 21 of the quantum dot emission layer 170 to emit the second light. The third light emitted from the third element of the light source 110 may pass through the blue pixel section 31. In the red pixel and green pixel sections, an optical element (blue light blocking layer 160 or optical filter) that blocks (e.g., reflects or absorbs) blue (and optionally green) light may be disposed. The blue light blocking layer 160 may be disposed on the second substrate 240. The blue light blocking layer 160 may be disposed on the first emission layer 11 and the second emission layer 21 between the second substrate 240 and the pattern of the quantum dot emission layer 170. Details of the blue light blocking layer 160 are the same as the following descriptions of the optical filter.

Such a display device may be manufactured by separately manufacturing a stacked structure including the aforementioned quantum dot emission layer and the aforementioned light source and then, assembling them. The display device may be manufactured by directly forming the pattern of the quantum dot emission layer on the light source.

The optical filter layer may block light having, for example, a portion of a wavelength region in the visible light region and may transmit light in the other wavelength regions. For example, the optical filter layer may block blue light and may transmit light except the blue light. For example, the optical filter layer may transmit at least one of green light, red light, or yellow which is a mixed color thereof.

The optical filter layer may include a polymer thin film including a dye and a pigment absorbing a wavelength which is to be blocked, and may absorb blue light of less than or equal to about 480 nm at greater than or equal to about 80%, greater than or equal to about 90%, greater than or equal to about 95%, but may have a light transmittance of greater than or equal to about 70%, greater than or equal to about 80%, greater than or equal to about 90%, and even about 100% to the other visible light at greater than about 500 nm and less than or equal to about 700 nm.

The optical filter layer may substantially absorb and block blue light at less than or equal to about 500 nm and may selectively transmit, for example green light or red light. In this case, at least two optical filter layers may be disposed spaced apart from one another at each position which is overlapped with at least one of the red color pixel section or green color pixel section. For example, the optical filter layer selectively transmitting red light may be disposed at a position which is overlapped with the red pixel section and the optical filter layer selectively transmitting green light may be disposed at a position which is overlapped with the green light emitting section.

For example, the optical filter layer may include at least one of a first region to block (e.g., absorb) blue light and green light and to selectively transmit light in a predetermined range (e.g., greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm) or a second region to block (e.g., absorb) blue light and red light and to selectively transmit light in a predetermined range (e.g., greater than or equal to about 500 nm, greater than or equal to about 510 nm, or greater than or equal to about 515 nm and less than or equal to about 550 nm, less than or equal to about 540 nm, less than or equal to about 535 nm, less than or equal to about 530 nm, less than or equal to about 525 nm, or less than or equal to about 520 nm). The first region may be disposed at a position overlapped with the green light emitting section and the second region may be disposed at a position overlapped with the red light emitting section. The first region and the second region may optically be isolated by for example, a black matrix.

Such an optical filter layer may contribute to improvement of color purity of the display device.

Hereinafter, the embodiments are illustrated in more detail with reference to examples. However, they are exemplary examples of the present disclosure, and the present disclosure is not limited thereto.

Analysis Method

1. Electroluminescence (EL) Spectroscopy

A current depending on a voltage is measured by using a Keithley 2635B source meter, while the voltage is applied, and electroluminescence (EL) is measured by using a CS2000 spectrometer.

2. Photoluminescence Spectroscopy

A photoluminescence spectroscopy is performed by using a Hitachi F-7000 spectrometer, while light is irradiated. The photoluminescence spectrum is used to evaluate a maximum emission peak wavelength, quantum efficiency, and a full width at half maximum (FWHM).

3. Ultraviolet-Visible (UV-Vis) Spectroscopy

An Agilent Cary5000 spectrometer is used to perform an ultraviolet (UV) spectroscopy and obtain a UV-Visible absorption spectrum.

4. Transmission Electron Microscopy (TEM) Analysis

A UT F30 Tecnai electron microscope is used to obtain transmission electron microscope images of prepared nanocrystals.

(2) UT F30 Tecnai electron microscope is used to perform a TEM-Energy Dispersive X-ray (EDX) analysis (element mapping).

5. Inductively Coupled Plasma (ICP) Analysis

Shimadzu ICPS-8100 is used to perform an inductively coupled plasma atomic emission spectroscopy (ICP-AES).

In the present specification, a synthesis is performed under an inert gas atmosphere (under a nitrogen flowing condition), unless particularly mentioned. Content of precursors are mol contents, unless particularly mentioned.

Synthesis Example 1: Synthesis of Red Light Emitting Quantum Dot (1) Preparation of InP Core 0.2 millimoles (mmol) of indium acetate, 0.6 mmol of palmitic acid, and 10 milliliters (mL) of 1-octadecene are put in a reactor and then, heated at 120° C. under vacuum. After one hour, an internal atmosphere of a reactor is converted into nitrogen. After heated at 280° C., a mixed solution of 0.1 mmol of tris(trimethylsilyl)phosphine (TMS3P) and 0.5 mL of trioctylphosphine is rapidly injected thereinto and reacted for 20 minutes. The reaction solution is cooled down to room temperature, and a precipitate obtained by adding acetone thereto and centrifuging the mixture is dispersed in toluene to obtain toluene dispersion of InP core.

(2) Preparation of InP/ZnS Red Light Emitting Semiconductor Nanocrystal 0.3 mmoL (0.056 grams (g)) of zinc acetate, 0.6 mmol (0.189 g) of oleic acid, and 10 mL of trioctylamine are put in a reaction flask and then, vacuum-treated at 120° C. for 10 minutes. The reaction flask is internally substituted with $N_2$ and heated to 220° C. The prepared toluene dispersion of InP core (optical density (OD):0.15) and 0.6 mmol of S/trioctylphosphine (TOP) are put in the reaction flask and then, heated to 280° C. and reacted for 30 minutes. When a reaction is complete, the reaction solution is rapidly cooled down to room temperature to obtain reaction products including the InP/ZnS quantum dots.

An excess amount of ethanol is added to the reaction products including the InP/ZnS quantum dots and then, centrifuged to remove an extra amount of an organic material therein. After the centrifugation, a supernatant is discarded, precipitates therefrom are dissolved again in hexane, and an excess amount of ethanol is added thereto and then, centrifuged again. The centrifuged precipitates are dried and then, dispersed in toluene. The synthesized quantum dots have a maximum emission peak wavelength of 630 nanometers (nm), a full width at half maximum (FWHM) of 35 nm, and $I_{R,440}:I_{R,458}$ of 1.4:1.

Synthesis Example 2: Synthesis of Green Light Emitting Quantum Dot

Green light emitting quantum dots are synthesized according to the same method as Synthesis Example 1 except that 0.25 mmol of zinc acetate is added. The synthesized quantum dots have a maximum emission peak wavelength of 530 nm, a full width at half maximum (FWHM) of 35 nm, and $I_{G,440}:I_{G,458}$ of 2.5:1.

Synthesis Example 3: Synthesis of Blue Light Emitting Quantum Dot 1

(1) Preparation of ZnTeSe Core 0.125 mmol of zinc acetate, 0.25 mmol of oleic acid, and 0.25 mmol of hexadecylamine along with 10 mL of trioctylamine are put in a reactor and then, heated at 120° C. under vacuum. After one hour, an internal atmosphere in the reactor is converted into nitrogen, and the reactor is heated to 300° C., and a ZnSeTe core is synthesized by rapidly injecting Se/TOP and Te/TOP thereinto in a Te:Se ratio of 1:30.

(2) Synthesis of Blue Light Emitting Quantum Dot 1 (B1) ZnTeSe/ZnSeS/ZnS 1.8 mmoL (0.336 g) of zinc acetate, 3.6 mmol (1.134 g) of oleic acid, and 10 mL of trioctylamine are put in a flask and vacuum-treated at 120° C. for 10 minutes. The flask is internally substituted with nitrogen ($N_2$) and heated to 180° C. The ZnTeSe core according to the (1) of Synthesis Example 3 is added thereto within 10 seconds and subsequently, reacted at 320° C. for 3 hours, while 1.2 mmol of Se/TOP, 2.8 mmol of STOP, and zinc oleate are added thereto in a dropwise fashion.

Synthesis Example 4: Synthesis of Blue Light Emitting Quantum Dot 2

(1) Preparation of ZnSe Core

A ZnSe core is synthesized according to the same method as the (1) of Synthesis Example 3 except that Te/TOP is not added.

(2) Synthesis of Blue Light Emitting Quantum Dot 2 (B2) ZnSe/ZnSeS/ZnS

Blue light emitting quantum dots 2 (B2) of ZnSe/ZnSeS/ZnS are synthesized according to the same method as the (2) of Synthesis Example 3 except that the ZnSe core according to Synthesis Example 4 is used instead of the ZnTeSe core according to the (1) of Synthesis Example 3.

Preparation Example 1: Preparation of Red Quantum Dot Emission Layer 30 weight percent (wt %) of lauryl methacrylate, 36 wt % of tricyclodecane dimethanol diacrylate, 4 wt % of trimethylol propane triacrylate, 20 wt % of epoxy diacrylate oligomer (manufacturer: Sartomer), 1 wt % of 1-hydroxy-cyclohexyl-phenyl-ketone, and 1 wt % of 2,4,6- trimethylbenzoyl-diphenyl-phosphine oxide are mixed to provide a mixture of monomer and oligomer. The mixture is defoamed under vacuum.

The toluene dispersion of the red light emitting quantum dot obtained in Synthesis Example 1 is mixed with the excess amount of ethanol again and centrifuged. The separated semiconductor nanocrystals is dispersed in 0.15 g (10 wt % of the entire composition except the initiator) of lauryl methacrylate and then added into the prepared mixture (1.35 g) and stirred (vortexed) to provide a quantum dot composition.

About 1 g of the quantum dot composition is drop-casted on a polyethylene terephthalate (PET) film (trader: I-component, hereinafter referred to a barrier film) sputtered with SiOx as a barrier film on one surface. The composition is covered with the barrier film and cured by UV for 10 seconds (light intensity: 100 milliwatts per square centimeter (mW/cm$^2$)) to provide a red quantum dot emission layer.

Preparation Example 2: Preparation of Green Quantum Dot Emission Layer

A green quantum dot emission layer is formed according to the same method as Preparation Example 1 except that the green light emitting quantum dots of Synthesis Example 2 are used instead of the red light emitting quantum dots of Synthesis Example 1.

Preparation Example 3: Manufacture of Light Source 1

An electroluminescent device (indium tin oxide (ITO)/poly(3,4-ethylenedioxythiophene):poly(styrenesulfonate) (PEDOT:PSS)/poly(9,9-dioctyl-fluorene-co-N-(4-butylphenyl)-diphenylamine) (TFB)/blue quantum dot (QD) emission layer/8-(4-(4,6-di(naphthalen-2-yl)-1,3,5-triazin-2-yl)phenyl)quinolone (ET204):8-hydroxyquinolinato lithium (Liq)/Al) including a layer including blue light emitting quantum dots (hereinafter, called to be a blue QD emission layer) including the blue light emitting quantum dots 1 (B1) according to Synthesis Example 3 is manufactured.

Specifically, on a substrate, an ITO electrode is deposited, PEDOT:PSS and TFB layers (a TFB molecular weight: 30,000) are formed thereon in a spin coating method. On the TFB layer, the octane dispersion of the quantum dots is spin-coated. An electron transport layer (ETL, ET204:Liq) is formed in a vacuum deposition method, and an Al electrode is deposited thereon.

While a voltage (0 to 7 volts (V)) is applied between the ITO electrode and the Al electrode, light emitting properties are measured.

The results are shown in Table 1.

TABLE 1

| Sample | EL (nm) | FWHM (nm) |
|--------|---------|-----------|
| B1 | 455 | 20 |

Preparation Example 4: Preparation of Light Source 2

A light source 2 is manufactured according to the same method as Preparation Example 3 by using the blue light emitting quantum dots 2 (B2) according to Synthesis Example 3 are used instead of the blue light emitting quantum dots (B1) according to Synthesis Example 4, and light emitting properties thereof are measured in the same method as above.

The results are shown in Table 2.

TABLE 2

| Sample | EL (nm) | FWHM (nm) |
|--------|---------|-----------|
| B2 | 440 | 15 |

Example 1: Manufacture of Display Device 1

A display device 1 is manufactured by disposing the red quantum dot emission layer of Preparation Example 1 in a red pixel section on the light source 1 of Preparation Example 3 and the green quantum dot emission layer of Preparation Example 2 in a green pixel section on the light source 1 of Preparation Example 3 but leaving a blue pixel section on the light source 1 of Preparation Example 3 to be empty.

Light emitting properties of the display device 1 are measured, and the results are shown in Table 3.

TABLE 3

| | Maximum emission peak wavelength (nm) | FWHM (nm) |
|---|---|---|
| R2 | 630 | 35 |
| G2 | 538 | 35 |
| B1 | 455 | 20 |

Example 2: Manufacture of Display Device 2

A display device 2 is manufactured by disposing the red quantum dot emission layer of Preparation Example 1 in a red pixel section on the light source 2 of Preparation Example 4 and the green quantum dot emission layer of Preparation Example 2 in a green pixel section on the light source 2 of Preparation Example 4 but using the light source 1 of Preparation Example 3 as a blue pixel section and keeping empty on the blue pixel section.

Light emitting properties of the display device 2 are measured, and the results are shown in Table 4.

TABLE 4

| | Maximum emission peak wavelength (nm) | FWHM (nm) |
|---|---|---|
| R2 | 630 | 35 |
| G2 | 538 | 35 |
| B1 | 455 | 20 |

Comparative Example: Manufacture of Comparative Display Device

The light emitting properties are measured by inserting the red quantum dot emission layer and the green quantum dot emission layer between a light guide and an optical sheet of 60-inch TV equipped with blue OLED and operating TV.

The results are shown in Table 5.

TABLE 5

| | Maximum emission peak wavelength (nm) | FWHM (nm) |
|---|---|---|
| R | 625 | 55 |
| G | 555 | 45 |
| B | 460 | 30 |

Referring to the results of Tables 3 to 5, the display devices of Examples 1 and 2 exhibit a smaller full width at half maximum (FWHM) of red light, green light, and blue light than that of the display device of Comparative Example, and a maximum emission peak wavelength of the blue light is present in a short wavelength range. Accordingly, the display devices of Examples 1 and 2 exhibit increased visibility and excellent color reproducibility and luminance compared with the display device of Comparative Example.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A display device comprising
a light source; and
a quantum dot emission layer disposed on the light source, wherein the quantum dot emission layer comprises:
  a first emission layer disposed in a red pixel of the display device, the red pixel being configured to emit a first light, and
  a second emission layer disposed in a green pixel of the display device, the green pixel being configured to emit a second light,
the light source comprises:
  a first portion configured to supply a first incident light to the first emission layer,
  a second portion configured to supply a second incident light to the second emission layer, and
  a third portion configured to supply a third light to a blue pixel of the display device,
the first emission layer comprises red light emitting quantum dots dispersed in a first polymer matrix,
the second emission layer comprises green light emitting quantum dots dispersed in a second polymer matrix,
each of the first portion, the second portion, and the third portion comprises:
  electrodes facing each other and
  a layer comprising blue light emitting quantum dots disposed between the electrodes,
at least one of the first incident light, the second incident light, or the third light has a maximum emission peak wavelength in a range of less than or equal to about 458 nanometers,
at least one of the first incident light, the second incident light, or the third light has a full width at half maximum of a maximum emission peak of less than or equal to about 30 nanometers, and
the red light emitting quantum dots, the green light emitting quantum dots, and the blue light emitting quantum dots comprise at least one of a Group II-VI compound or a Group III-V compound and do not comprise cadmium, mercury, or lead.

2. The display device of claim 1, wherein the blue light emitting quantum dots comprise at least one of ZnSe, ZnTe, ZnS, ZnSeTe, ZnSeS, ZnSTe, or ZnTeSeS; or
at least one of InP, GaP, InAs, GaAs, InSb, GaSb, InGaP, InAsP, or InSbP.

3. The display device of claim 1, wherein
the blue light emitting quantum dots comprise a Group II-VI compound,
the Group II-VI compound comprises zinc and tellurium, and
a mole ratio of the tellurium relative to the zinc is less than or equal to about 0.1:1.

4. The display device of claim 1, wherein a maximum emission peak wavelength of the third light is different from a maximum emission peak wavelength of the first incident light.

5. The display device of claim 1, wherein a maximum emission peak wavelength of the third light is different from a maximum emission peak wavelength of the second incident light.

6. The display device of claim 1, wherein the first incident light and the second incident light each independently have a maximum emission peak wavelength in a range of less than or equal to about 450 nanometers.

7. The display device of claim 1, wherein the first incident light and the second incident light each independently have a maximum emission peak wavelength in a range of less than or equal to about 440 nanometers.

8. The display device of claim 1, wherein at least one of the first incident light, the second incident light, or the third light has a full width at half maximum (FWHM) of a maximum emission peak of less than or equal to about 25 nanometers.

9. The display device of claim 1, wherein at least one of the first incident light, or second incident light, and the third light has a full width at half maximum (FWHM) of a maximum emission peak of less than or equal to about 20 nanometers.

10. The display device of claim 1, wherein the layer comprising blue light emitting quantum dots further comprises green light emitting quantum dots.

11. The display device of claim 1, wherein each of the first portion and the second portion comprises:
  electrodes facing each other and
  a layer comprising blue light emitting quantum dots disposed between the electrodes; and
the third portion comprises
  electrodes facing each other and
  a layer comprising blue light emitting quantum dots and green light emitting quantum dots disposed between the electrodes.

12. The display device of claim 1, wherein the display device comprises:
  a first partition between the first portion and the second portion, the first partition optically isolating the first portion and the second portion,
  a second partition between the first portion and the third portion, the second partition optically isolating the first portion and the third portion, and
  a third partition between the second portion and the third portion, the third partition optically isolating the second portion and the third portion.

13. The display device of claim 1, wherein a maximum emission peak wavelength of the second light is in a range of less than or equal to about 545 nanometers.

14. The display device of claim 1, wherein at least one of a maximum emission peak of the first light or a maximum emission peak of the second light has a full width at half maximum of less than or equal to about 45 nanometers.

15. The display device of claim 1, wherein a ratio of an overlapping area of an emission spectrum of the first light and an emission spectrum of the second light to a total area of the emission spectrum of the first light is less than or equal to about 0.1:1; or a ratio of the overlapping area to a total area of the emission spectrum of the second light is less than or equal to about 0.1:1.

16. The display device of claim 1, wherein a ratio of an overlapping area of an emission spectrum of the second light and an emission spectrum of the third light to a total area of the emission spectrum of the second light is less than or equal to about 0.01:1; or a ratio of the overlapping area to a total area of the emission spectrum of the third light is less than or equal to about 0.01:1.

17. The display device of claim 1, wherein, in an ultraviolet-visible absorption spectrum of the red light emitting quantum dots, a ratio between an absorption intensity at a wavelength of 440 nanometers and an absorption intensity at a wavelength of 458 nanometers is greater than or equal to about 1.0:1 and less than or equal to about 10:1.

18. The display device of claim 1, wherein, in an ultraviolet-visible absorption spectrum of the green light emitting quantum dots, a ratio between an absorption intensity at a wavelength of 440 nanometers and an absorption intensity at a wavelength of 458 nanometers is greater than or equal to about 1.3:1 and less than or equal to about 20:1.

19. The display device of claim 1, wherein the first polymer matrix and the second polymer matrix each independently comprises at least one of a cross-linking polymer or a binder polymer having a carboxylic acid group.

20. The display device of claim 19, wherein the cross-linking polymer comprises at least one of a polymerization product of a photopolymerizable monomer having a carbon-carbon double bond or a polymerization product of the photopolymerizable monomer and a multiple thiol compound having at least two thiol groups at a terminal end thereof.

21. The display device of claim 1, wherein the display device further comprises a light transmittance layer disposed within the blue pixel, the light transmittance layer transmitting the third light provided by the third portion.

22. The display device of claim 21, wherein the display device further comprises:

a fourth partition between the first emission layer and the light transmittance layer, the fourth partition optically isolating the first emission layer and the light transmittance layer, a fifth partition between the second emission layer and the light transmittance layer, the fifth partition optically isolating the second emission layer and the light transmittance layer, and a sixth partition between the first emission layer and the second emission layer, the sixth partition optically isolating the first emission layer and the second emission layer.

23. The display device of claim 1, wherein the display device has a color reproducibility of greater than or equal to about 85% according to the International Telecommunication Union (ITU)-R Recommendation BT. 2020.

* * * * *